(12) United States Patent
Hashizume et al.

(10) Patent No.: US 10,504,869 B2
(45) Date of Patent: Dec. 10, 2019

(54) SEMICONDUCTOR DEVICE

(71) Applicant: RENESAS ELECTRONICS CORPORATION, Tokyo (JP)

(72) Inventors: Shoji Hashizume, Gunma (JP); Yasushi Takahashi, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 106 days.

(21) Appl. No.: 15/710,619

(22) Filed: Sep. 20, 2017

(65) Prior Publication Data
US 2018/0096961 A1 Apr. 5, 2018

(30) Foreign Application Priority Data

Sep. 30, 2016 (JP) .................. 2016-192872

(51) Int. Cl.
*H01L 23/00* (2006.01)
*H01L 23/31* (2006.01)
*H01L 23/495* (2006.01)

(52) U.S. Cl.
CPC .......... *H01L 24/49* (2013.01); *H01L 23/3114* (2013.01); *H01L 23/49503* (2013.01); *H01L 23/49562* (2013.01); *H01L 23/49582* (2013.01); *H01L 24/32* (2013.01); *H01L 24/48* (2013.01); *H01L 23/4952* (2013.01); *H01L 23/49555* (2013.01); *H01L 24/06* (2013.01); *H01L 24/45* (2013.01); *H01L 24/83* (2013.01); *H01L 24/85* (2013.01); *H01L 24/92* (2013.01); *H01L 24/97* (2013.01); *H01L 2224/2929* (2013.01); *H01L 2224/29101* (2013.01); *H01L 2224/29339* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48247* (2013.01); *H01L 2224/48472* (2013.01);
(Continued)

(58) Field of Classification Search
CPC ................. H01L 24/49; H01L 23/3114; H01L 23/49534; H01L 23/49582; H01L 23/49562
See application file for complete search history.

(56) References Cited

U.S. PATENT DOCUMENTS 5,530,284 A 6/1996 Bailey
7,084,491 B2 8/2006 Satou et al.
(Continued)

FOREIGN PATENT DOCUMENTS

JP 08-264697 A 10/1996
JP 2005-026294 A 1/2005

*Primary Examiner* — Wael M Fahmy
*Assistant Examiner* — Sarah K Salerno
(74) *Attorney, Agent, or Firm* — McDermott Will & Emery LLP

(57) ABSTRACT

To improve a performance of a semiconductor device, a semiconductor device includes a lead electrically coupled to a semiconductor chip via a wire. An inner portion of the lead, the semiconductor chip, and the wire are sealed by a sealing body (a resin sealing body). The wire is bonded to an upper surface of a wire bonding portion of the inner portion of the lead. A metal film is formed on a lower surface of the inner portion of the lead, which is on an opposite side to the upper surface. No metal film is formed on the upper surface of the wire bonding portion.

11 Claims, 24 Drawing Sheets

(52) U.S. Cl.
CPC ............ *H01L 2224/4903* (2013.01); *H01L 2224/73265* (2013.01); *H01L 2224/83862* (2013.01); *H01L 2224/85205* (2013.01); *H01L 2224/85385* (2013.01); *H01L 2224/85439* (2013.01); *H01L 2224/85455* (2013.01); *H01L 2224/92247* (2013.01); *H01L 2924/13055* (2013.01); *H01L 2924/181* (2013.01); *H01L 2924/35121* (2013.01)

(56) References Cited

U.S. PATENT DOCUMENTS

| | | | | |
|---|---|---|---|---|
| 2011/0068442 | A1* | 3/2011 | Satoh | H01L 21/4842 |
| | | | | 257/666 |
| 2012/0248591 | A1* | 10/2012 | Kure | H01L 23/49582 |
| | | | | 257/676 |
| 2013/0228907 | A1* | 9/2013 | Nakajo | H01L 24/49 |
| | | | | 257/676 |
| 2016/0289443 | A1* | 10/2016 | Iwatani | H01L 23/293 |
| 2018/0053709 | A1* | 2/2018 | Crema | H01L 23/49548 |

* cited by examiner

SEMICONDUCTOR DEVICE

CROSS-REFERENCE TO RELATED APPLICATIONS

The disclosure of Japanese Patent Application No. 2016-192872 filed on Sep. 30, 2016 including the specification, drawings and abstract is incorporated herein by reference in its entirety.

BACKGROUND

The present invention relates to a semiconductor device and, for example, relates to a semiconductor device in which a portion of a lead, to which a wire is coupled is sealed by a resin sealing body.

Japanese Unexamined Patent Application Publication No. 2005-26294 describes a power semiconductor device in which a portion of a lead which a wire is coupled is sealed by a resin sealing body.

Japanese Unexamined Patent Application Publication No. Hei 8 (2011)-264697 describes a semiconductor device in which a metal film is formed on a bonding surface side of a lead and a wire is bonded to a portion of the lead which is exposed from the metal film.

SUMMARY

The inventors of the present application are studying improvement of a performance of a semiconductor device. For example, components of the semiconductor device include a metal member, such as a lead frame, and a resin sealing body sealing a semiconductor chip. Because a difference of a coefficient of linear expansion between the resin sealing body and the metal member is large, thermal stress is caused by this difference of the coefficient of linear expansion. It was found that, when a range of a use environment temperature of a product was made wider as a part of measures for improving the performance of the semiconductor device, the thermal stress became larger at an upper limit temperature (e.g., about 260° C.) and therefore peeling caused by the thermal stress occurred at a bonding interface between the resin sealing body and the metal member. Further, in a case where the semiconductor chip and the lead are electrically coupled to each other via a wire, when the above peeling occurs in the vicinity of a coupling portion between the wire and the lead, the peeling has an adverse effect on electric reliability of the semiconductor device.

Other problems and novel features will he apparent from the description of this specification and the accompanying drawings.

A semiconductor device according to an embodiment includes a lead electrically coupled to a semiconductor chip via a wire. An inner portion of the lead, the semiconductor chip, and the wire are sealed by a resin sealing body. The wire is bonded to one surface of a wire bonding portion in the inner portion of the lead. A metal film is formed on a surface in the inner portion of the lead, which is opposite to the one surface. No metal film is formed on the one surface of the wire bonding portion.

According to the embodiment, it is possible to improve a performance of a semiconductor device.

Figure 1:
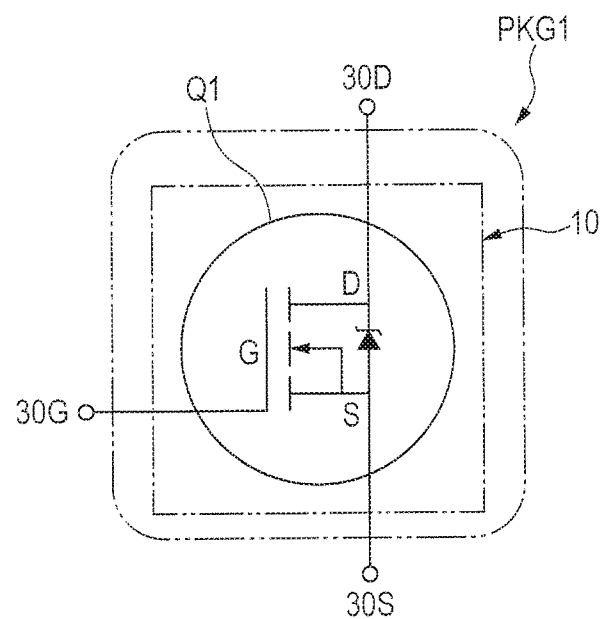
FIG. 1 schematically illustrates an example of a circuit included in a semiconductor device according to an embodiment.

DETAILED DESCRIPTION (Manner of Description, Basic Terms, and Usage of Terms in the Present Application)

In the present application, the following embodiment will be described while being divided into a plurality of sections or embodiments, if necessary for the sake of convenience. However, unless otherwise specified, these are not independent of each other, but are in a relation such that these are portions of a single example, one is details or a modification example of a part or the whole of the other irrespective of order of the description thereof. In addition, the description of the same or similar portions are not repeated in principle. Further, each constitutional element in the embodiment is not essential, unless otherwise specified or except the case where the constitutional element is essential ideally or the case where it is clear from the context that the constitutional element is essential.

In the description of embodiments and the like, a phrase "X including A" is used for a material, composition, or the like. However, this phrase is not intended to exclude a constitutional element other than A, unless otherwise specified or except the case where it is clear from the context that a constitutional element is only A. For example, with regard to a component, this phrase means "X including A as a main component", or the like. For example, it is naturally understood that a phrase "silicon member" or the like is not intended to be limited to pure silicon, but is intended to also include a member that contains SiGe (silicon-germanium) alloy, other multicomponent alloy containing silicon as a main component, and another additive, for example. Further, when a reference is made to "gold plating", "a Cu layer", "nickel plating", and the like, these phrases are not intended to be limited to pure gold, copper, nickel, and the like, but are intended to also include members mainly containing gold, Cu, nickel, and the like, respectively, as main component, unless otherwise specified.

Further, when a reference is made to a specific value or a specific amount, a value exceeding the specific value or a value less than the specific value may be used, unless otherwise specified, or except the case where the value is apparently limited to the specific value ideally, or except for the case where the value is limited to the specific value from the context.

Throughout the drawings of the embodiments, the same or similar portions are labeled with the same or similar reference signs or numbers, and the description thereof is not repeated in principle.

Further, in the accompanying drawings, hatching or the like is omitted even in a cross-section in a case where the hatching makes the drawings complicated or a case where the cross-section can be clearly distinguished from a space. In association with this, an outline in the background is omitted even for a closed hole in a plane if the outline is apparent from the description or the like. Further, in order to clearly illustrate that a portion is not a space or to clearly illustrate a boundary of a region, hatching or a dotted pattern may be added even when the portion is not a cross-section.

In the following description, terms including "contact", "adhesion", "bonding", "peeling, and "coupling" are used to mean as follows. The term "contact" refers to a state where separatable two members are in contact with each other at least partly. The term "adhesion" refers to a state where separatable two members (members to be adhered) are at least partly joined to each other via an adhesive and are fixed to each other. The term "bonding" refers to a state where separatable two members (members to be bonded) are at least partly joined and fixed to each other. The above-described term "joining" includes a mechanical joining, such as the anchoring effect, joining by physical interaction, such as an intermolecular force, and joining by a chemical interaction, such as a covalent bond. Further, the term "bonding" also includes a case where no member is interposed between the members to be bonded, in addition to a case where another member (e.g., an adhesive) is interposed between the members to be bonded. That is, a "bonded state" includes an "adhering state". The "peeling" means that the above-described "joined" state is released and is changed to a state where the members can be separated. Further, when "peeling" is simply used, both a case where a joined state is released in an entire bonding portion between two members and a case where the joining state is released in a portion of the bonding portion are included. In addition, the term "coupling" refers to a state where two members communicate with each other (a coupling path is not interrupted in the middle but is continuous). It does not matter whether another member is interposed between the two members. For example, "a state where a member A and a member B are electrically coupled" means a state where the member A and the member B can electrically communicate with each other, and also includes a case where a member C is interposed between the member A and the member B. Also, "a state where the member A and the member B are coupled to each other" means a state where the member A and the member B are fixed to each other, and also includes a case where the member C is interposed between the member A and the member B. Further, "the state where the member A and the member B are coupled to each other" also includes a case where the member A and the member B are formed as one piece that cannot be separated from each other, but are distinguished from each other in view of a shape or a function. The state where the member A and the member B are formed as one piece may be referred to as "linking".

In the following description, in a case where solder, a solder member, a solder material, or a solder component is referred to, that term means Sn—Pb solder containing lead (Pb) or so-called lead-free solder that contains substantially no Pb, for example. Examples of lead-free solder include tin (Sn) only, tin-bismuth (Sn—Bi), tin-copper-silver (Sn—Cu—Ag), and tin-copper (Sn—Cu). Lead-free solder described herein means a lead content is 0.1 wt % or less. This content is defined as a reference in RoHS (Restriction of Hazardous Substances) Directive.

In the present embodiment, a semiconductor device is described as an example, which is called a power device or a power semiconductor device that is incorporated in a power control circuit, such as a power-source circuit. The semiconductor device described below is incorporated into a power conversion circuit and functions as a switching element.

<Example of Circuit Configuration>

Figure 2:
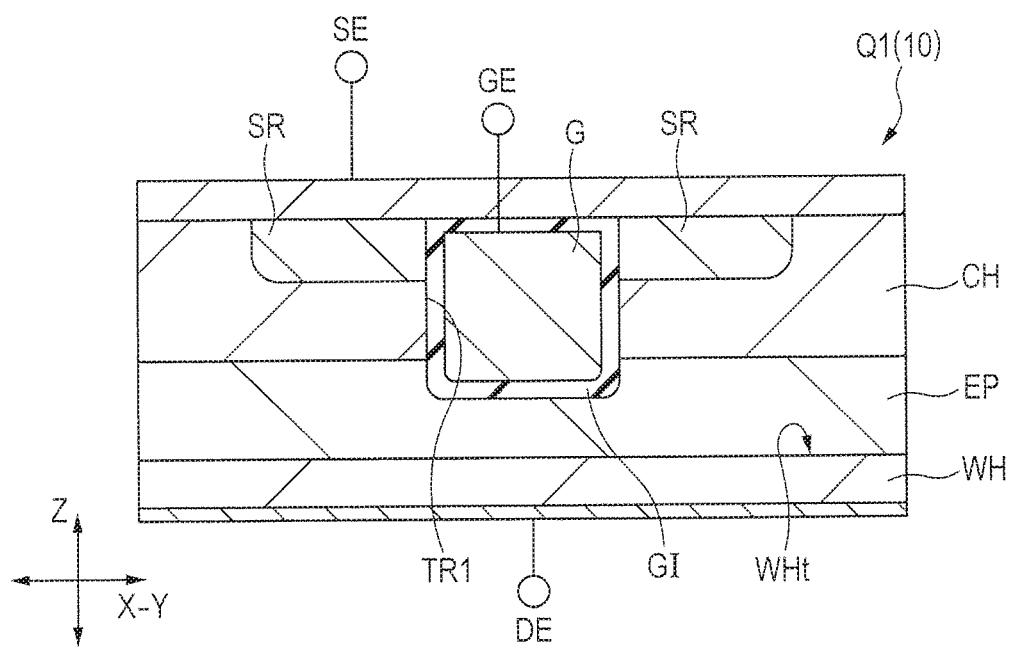
FIG. 2 is a cross-sectional view illustrating a structure example of a main portion of a field effect transistor illustrated in FIG. 1, illustrating a structure example.

FIG. 1 schematically illustrates an example of a circuit included in a semiconductor device according to the present embodiment. FIG. 2 is a cross-sectional view of a main portion of a field effect transistor illustrated in FIG. 1, illustrating a structure example.

A semiconductor device for controlling a power, called a power semiconductor device, may include a semiconductor element, such as a diode, a thyristor, or a transistor. Transistors are used in various fields. A transistor incorporated in a power control circuit in which a large current of 1 A or more, for example, flows and operating as a switching element as in the present embodiment is called a power transistor. A semiconductor device PKG1 of the present embodiment includes a semiconductor chip 10 in which a transistor Q1 that is a power transistor is formed, as illustrated in FIG. 1. In the example illustrated in FIGS. 1 and 2, the transistor Q1 formed in the semiconductor chip 10 is a field effect transistor, more specifically, a MOSFET (Metal Oxide Semiconductor Field Effect Transistor). In a power semiconductor device, a transistor is used as a switching element, for example. A MOSFET used in the power semiconductor device is called a power MOSFET.

The above-described MOSFET is used as a term that widely represents a field effect transistor having a structure in which a gate electrode formed of a conductive material is arranged on a gate insulation film. Therefore, even when the term MOSFET is used, it is not intended to exclude a gate insulation film other than an oxide film. Further, even when the term MOSFET is used, it is not intended to exclude a gate electrode material other than a metal, for example, polysilicon.

The transistor Q1 illustrated in FIG. 1 is formed by an n-channel field effect transistor illustrated in FIG. 2, for example. FIG. 2 is a cross-sectional view of a main portion of the field effect transistor illustrated in FIG. 1, illustrating a structure example.

In the example of FIG. 2, an $n^-$-type epitaxial layer EP is formed on a principal surface WHt of a semiconductor substrate WH made of n-type polycrystalline silicon, for example. The semiconductor substrate WH and the epitaxial layer EP form a drain region (a region corresponding to a drain D illustrated in FIG. 1) of a MOSFET. This drain region is electrically coupled to a drain electrode DE formed on a back surface side of the semiconductor chip 10.

A channel forming region CH that is a $p^+$-type semiconductor region is formed on the epitaxial layer EP. A source region (a region corresponding to a source S illustrated in FIG. 1) SR, which is an $n^+$-type semiconductor region, is formed on the channel forming region CH. The source region SR is electrically coupled to a source electrode pad SE formed on a principal surface side of the semiconductor chip 10 via lead wiring. Further, a trench (an opening, a groove) TR1 is formed in a semiconductor region stacked on the semiconductor substrate WH, which extends through the channel forming region CH from an upper surface of the source region SR and reaches the inside of the epitaxial layer EP.

A gate insulation film GI is formed on an inner wall of the trench TR1. On the gate insulation film GI, a gate electrode G is formed such the trench TR1 is embedded with the gate electrode G. The gate electrode G is electrically coupled to a gate electrode pad GE of the semiconductor chip 10 via lead wiring.

In the transistor Q1, a channel is formed in a thickness direction because the drain region and the source region SR are arranged in the thickness direction with the channel forming region CH interposed therebetween (hereinafter, this structure is referred to as a vertical channel structure). In this case, an occupied area of an element in plan view can be reduced as compared with a field effect transistor having a channel formed along the principal surface WHt. Therefore, the planar size of the semiconductor chip 10 can be reduced.

Further, in the above-described vertical channel structure, an on-resistance can be reduced because a channel width per unit area can be increased in plan view. Note that FIG. 2 illustrates the structure of a field effect transistor, and a plurality of (a number of) transistors Q1 having the structure illustrated in FIG. 2, for example, are coupled in parallel in the semiconductor chip 10 illustrated in FIG. 1. With this configuration, it possible to configure a power MOSFET that allows a large current exceeding 1 A, for example, to flow therein.

In a case where the MOSFET is configured by coupling a plurality of transistors Q1 having the vertical channel structure in parallel as described above, electrical characteristics of the MOSFET (mainly, breakdown characteristics, on-resistance characteristics, and capacitance characteristics) change in accordance with the planar size of the semiconductor chip 10. For example, when the planar area of the semiconductor chip 10 is increased, the number of the transistors Q1 as cells coupled in parallel (i.e., the number of elements) also increases, and therefore the on-resistance is lowered and a capacitance increases.

Although FIGS. 1 and 2 illustrate the MOSFET as an example of a power transistor included in a power semiconductor device, various modified examples can be employed. For example, in place of the MOSFET, an insulated gate bipolar transistor (IGBT) may be included.

<Semiconductor Device>

Figure 3:
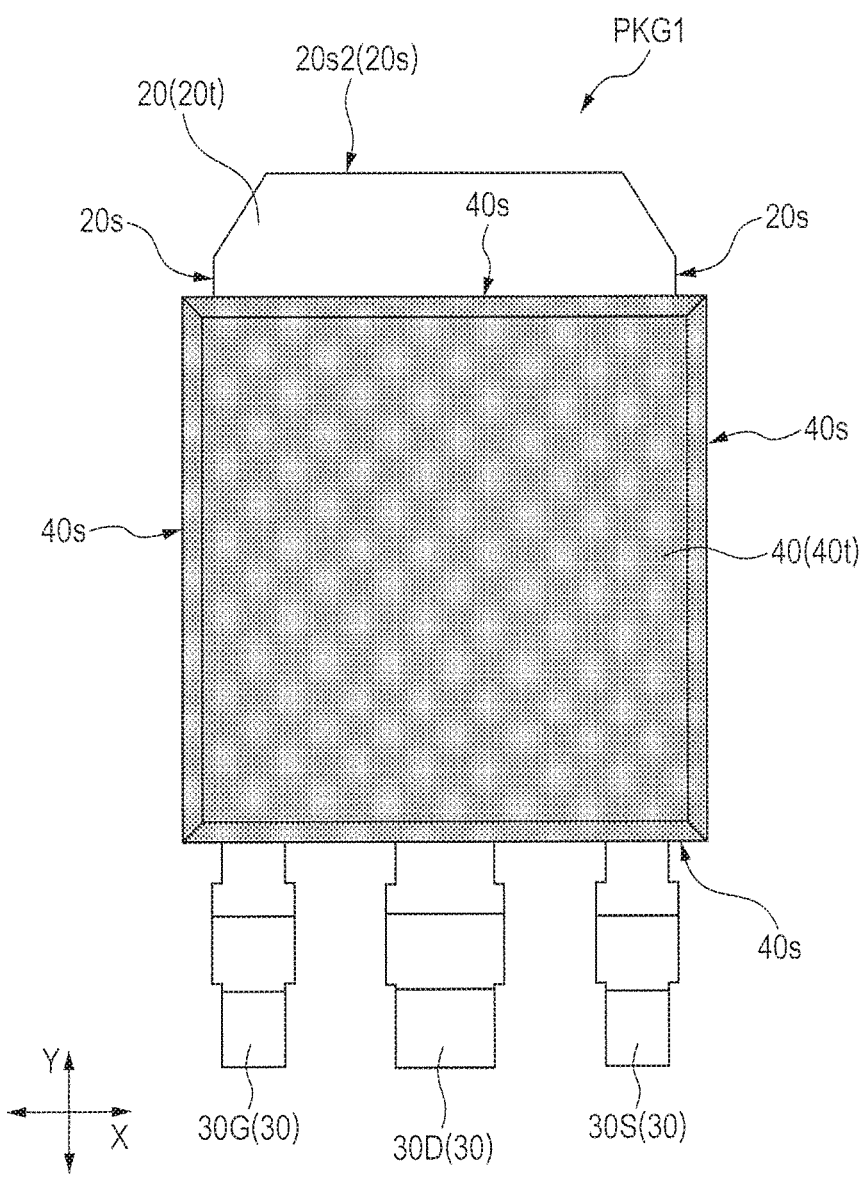
FIG. 3 is a top view of the semiconductor device illustrated in FIG. 1.
Figure 4:
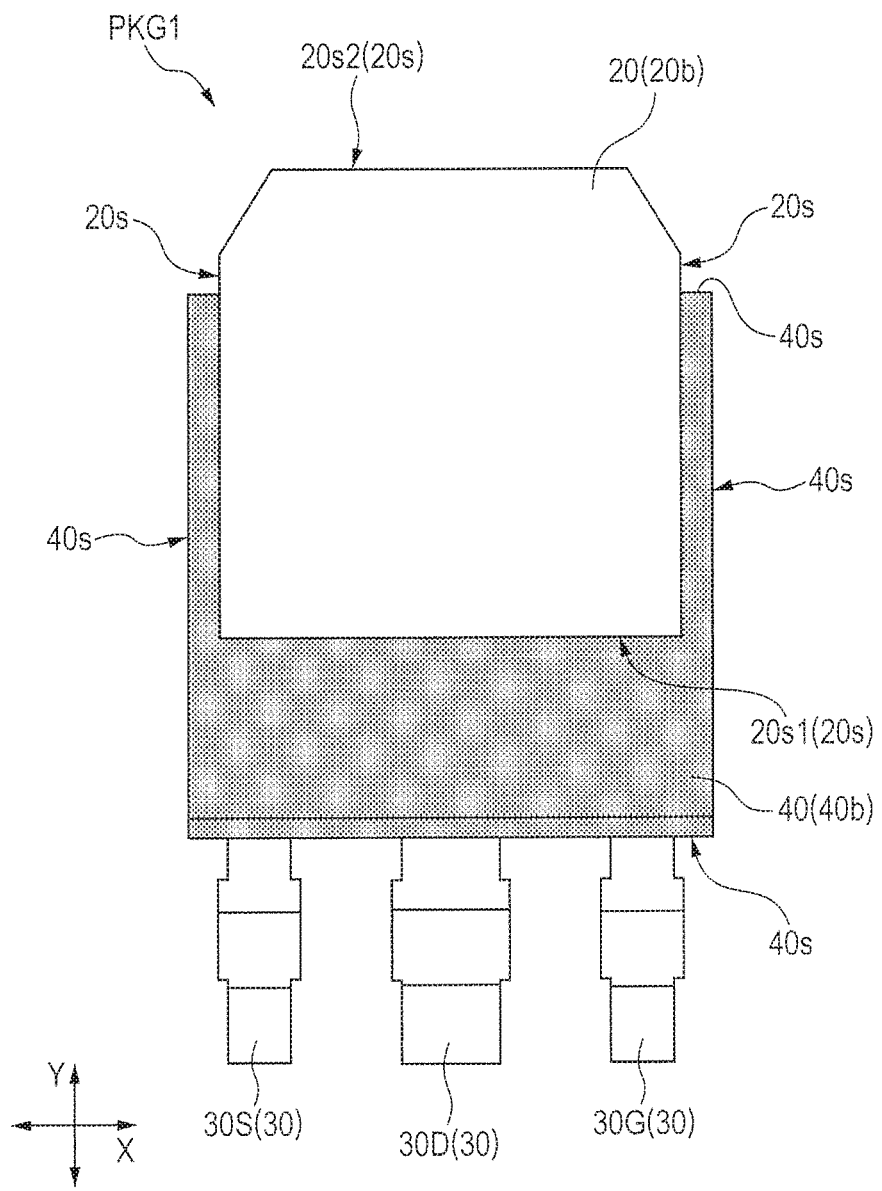
FIG. 4 is a bottom view of the semiconductor device illustrated in FIG. 3.
Figure 5:
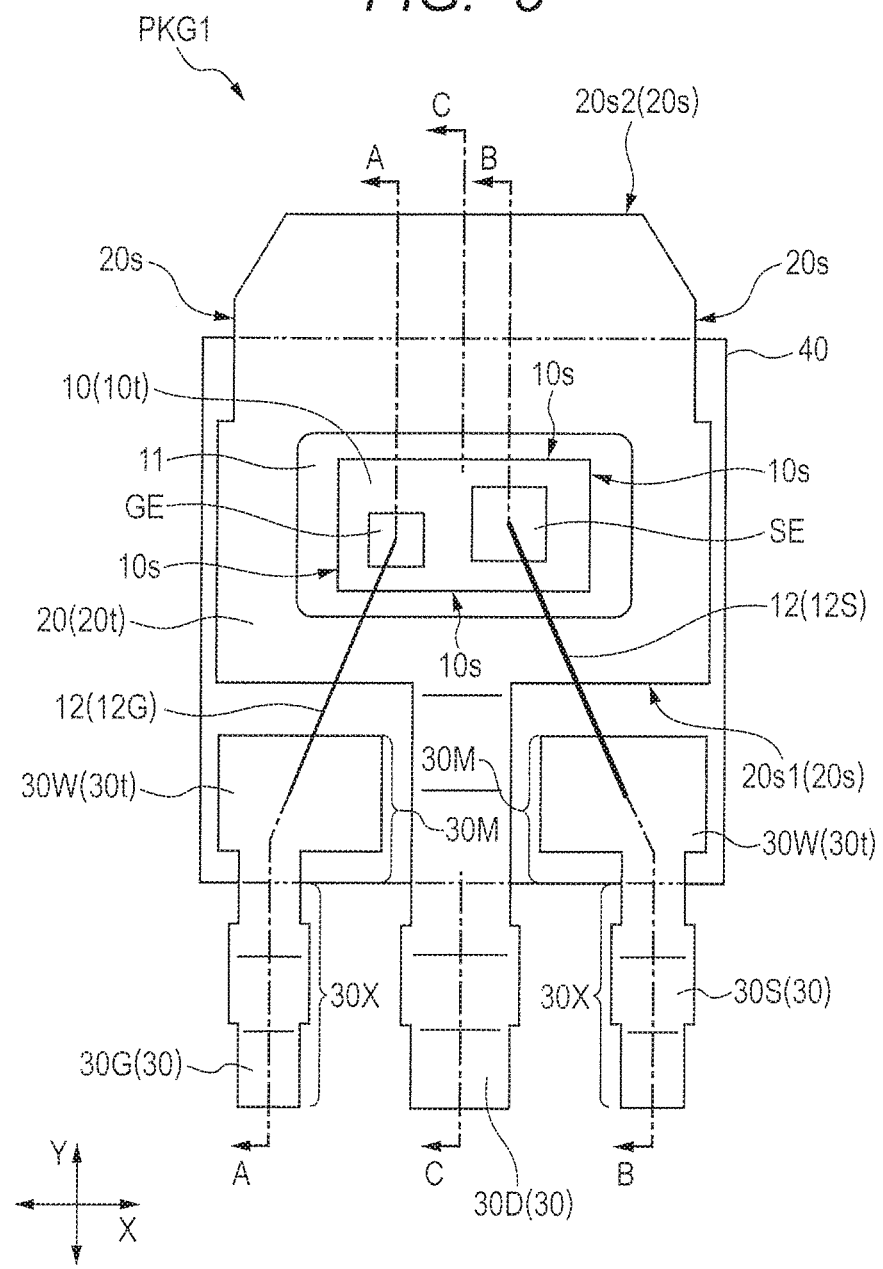
FIG. 5 is a transparent plan view illustrating an internal structure of the semiconductor device illustrated in FIG. 3, from which a sealing body is removed.
Figure 6:
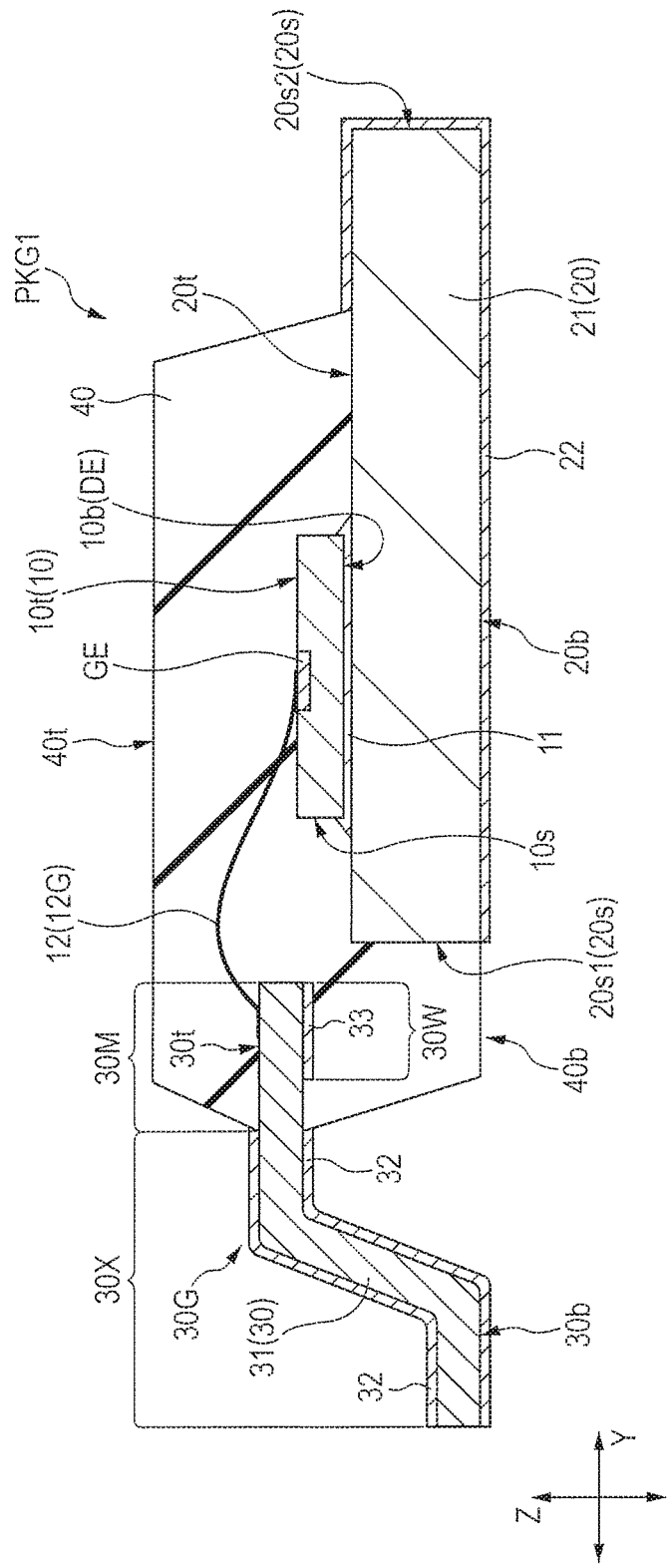
FIG. 6 is a cross-sectional view taken along line A-A in FIG. 5.

Next, a package structure of the semiconductor device PKG1 illustrated in FIG. 1 is described. FIG. 3 is a top view of the semiconductor device illustrated in FIG. 1. FIG. 4 is a bottom view of the semiconductor device illustrated in FIG. 3. FIG. 5 is a transparent plan view illustrating an internal structure of the semiconductor device, while a sealing body illustrated in FIG. 3 is removed. FIG. 6 is a cross-sectional view taken along line A-A in FIG. 5, FIG. 7 is a cross-sectional view taken along line B-B in FIG. 5, and FIG. 8 is a cross-sectional view taken along line C-C in FIG. 5.

The semiconductor device PKG1 of the present embodiment includes the semiconductor chip 10 (see FIGS. 5 and 6), a die pad (a metal plate, a chip mounting portion, a heat dissipation plate) 20 on which the semiconductor chip 10 is mounted (see FIGS. 4 to 6), and a plurality of leads (terminals) 30 that are external terminals. The semiconductor chip 10 and the leads 30 are electrically coupled to each other via a plurality of wires 12 (see FIGS. 5 and 6). The semiconductor chip 10, an upper surface 20t of the die pad 20, and inner portions (inner lead portions, sealed portions) 30M of the respective leads 30 (see FIGS. 5 and 6) are sealed by a sealing body (a resin sealing body, a resin body, a mold resin) 40.

In the present embodiment, each of the leads 30 is arranged alongside the die pad 20 in Y direction, and the leads 30 are arranged in X direction that crosses Y direction (at a right angle in the example of FIG. 5). Further, in the example illustrated in FIG. 5, a lead for source (a source lead, a source terminal) 30S, a lead for drain (a drain lead, a drain terminal) 30D, and a lead for gate (a gate lead, a gate terminal) 30G are arranged in X direction in turn in plan view. Each of the leads 30 includes the inner portion 30M sealed by the sealing body 40 and an outer portion (an outer lead portion, an exposed portion) 30X exposed from the sealing body 40.

Figure 7:
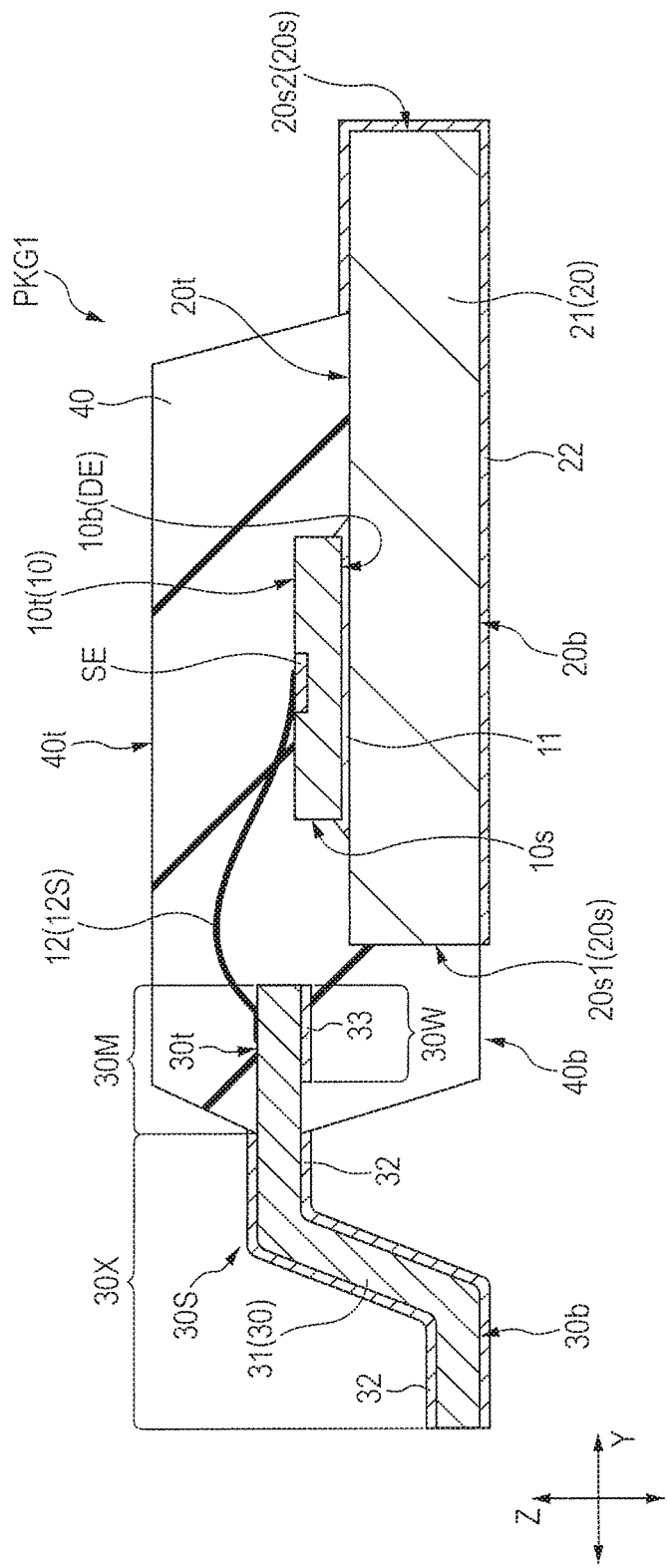
FIG. 7 is a cross-sectional view taken along line B-B in FIG. 5.
Figure 8:
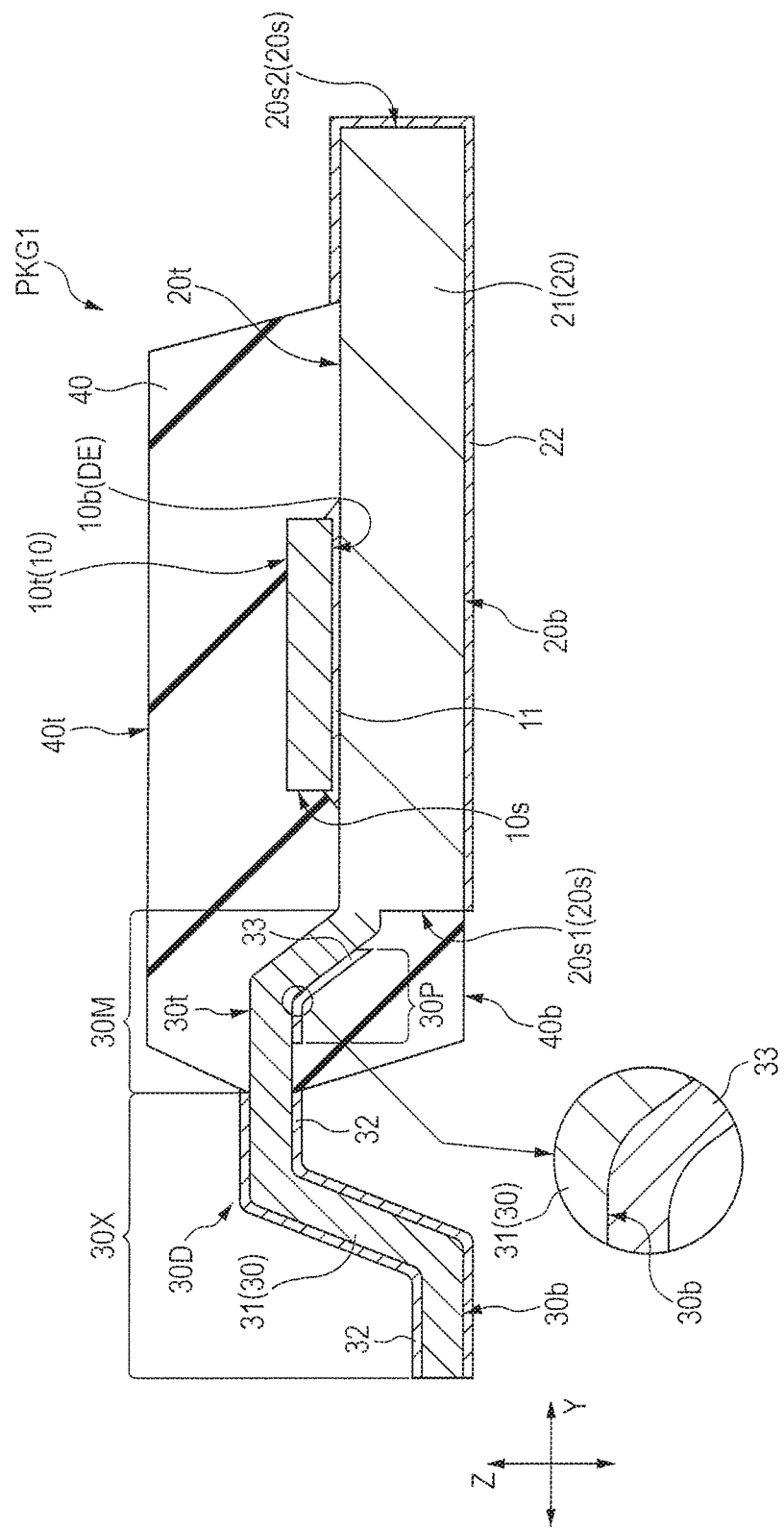
FIG. 8 is a cross-sectional view taken along line C-C in FIG. 5.

As illustrated in FIGS. 6 to 8, the semiconductor chip 10 has a front surface (a surface, an upper surface) 10t, and a back surface (a surface, a lower surface) 10b located on the opposite side to the front surface 10t. As illustrated in FIG. 5, the front surface 10t (or the back surface 10b illustrated in FIG. 6) of the semiconductor chip 10 is quadrangular in plan view, and has four side surfaces 10s in its peripheral portions. In the example illustrated in FIG. 5, the semiconductor chip 10 is rectangular in plan view, and its long sides are arranged to extend along X direction.

As illustrated in FIG. 5, the gate electrode pad GE to be electrically coupled to the gate electrode G illustrated in FIG. 1 and the source electrode pad SE to be electrically coupled to the source S illustrated in FIG. 1 are formed on the front surface 10t of the semiconductor chip 10. Also, as illustrated in FIGS. 6 to 8, the drain electrode DE to be electrically coupled to the drain D illustrated in FIG. 1 is formed on the back surface 10b of the semiconductor chip 10. In the example illustrated in FIGS. 6 to 8, the back surface 10b of the semiconductor chip 10 entirely serves as the drain electrode DE.

In a case where the semiconductor chip 10 has a vertical channel structure as illustrated in FIG. 2, the on-resistance can be reduced by making the semiconductor chip 10 thinner (making a distance between the front surface 10t and the back surface 10b illustrated in FIG. 6 smaller). Meanwhile, from a viewpoint of increasing a heat capacity of the die pad 20 or increasing a cross-sectional area of a conductive path in which a current flows, it is preferable that the die pad 20 is thick. Therefore, in the example illustrated in FIGS. 6 to 8, the die pad 20 is thicker than the semiconductor chip 10. For example, the thickness of the die pad 20 is 400 µm or more in the example illustrated in FIGS. 6 to 8.

Further, as illustrated in FIGS. 5 to 8, the semiconductor device PKG1 includes the die pad (the metal plate, the chip mounting portion, the heat dissipation plate) 20 on which the semiconductor chip 10 is mounted. As illustrated in FIGS. 6 to 8, the die pad 20 includes an upper surface (a surface, a principal surface, a front surface, a chip mounting surface) 20t on which the semiconductor chip 10 is mounted via a die bonding material 11 and a lower surface (a surface, a principal surface, a back surface, an exposed surface, a mounting surface) 20b on the opposite side to the upper surface 20t. In the example illustrated in FIG. 5, the planar size of the semiconductor chip 10 (the area of the front surface 10t) is smaller than the planar size of the die pad 20 (the area of the upper surface 20t). Further, the die pad 20 includes a plurality of side surfaces 20s that are continuous with the lower surface 20b, in its peripheral portions as illustrated in FIG. 4.

Also, the die pad 20 is formed integrally with the lead 30D that is the drain terminal, as illustrated in FIGS. 5 and 8. The lead 30D is an external terminal to be electrically coupled to the drain D illustrated in FIG. 1. As illustrated in FIG. 6, the drain electrode DE to be coupled to the drain D of the transistor Q1 (see FIG. 1) that is a MOSFET is formed on the back surface 10b of the semiconductor chip 10. The drain electrode DE is electrically coupled to the die pad 20 via the die bonding material 11 made of a conductive material. The die bonding material 11 is solder or a conductive resin that is obtained by setting a mixture of conductive particles, e.g., silver (Ag) particles, and a resin. The lead 30D is coupled to the die pad 20, and is electrically coupled to the drain electrode DE of the semiconductor chip 10 via the die pad 20 and the die bonding material 11. The lead 30D is also coupled (joined) to the die pad 20, and functions as a suspension lead that supports the die pad 20 in manufacturing steps of the semiconductor device described later.

Because the lower surface 20b of the die pad 20 is exposed from the sealing body 40 in the present embodiment, the die pad 20 itself may be used as the drain terminal. Further, because an embodiment using a MOSFET as an example of a power transistor is described in the present embodiment, the lead 30 and the die pad 20 serve as the drain terminal of the semiconductor device PKG1 on a circuit. However, in a modified example that uses an IGBT as the power transistor, collector electrode is formed on a back surface of a semiconductor chip. Therefore, in the case where the power transistor is the IGBT, the lead 30 and the die pad 20 operate as a collector terminal of the semiconductor device PKG1 on a circuit.

As illustrated in FIG. 5, each of the side surfaces 20s of the die pad 20 includes a side surface 20s1 that is provided to be opposed to a corresponding lead 30 in plan view and the side surface 20s1 is sealed by the sealing body 40. Also, the side surfaces 20s each include a side surface 20s2 that is provided on the opposite side to the side surface 20s1, is exposed from the sealing body 40 and is covered with a metal film 22 (see FIG. 6).

As illustrated in FIGS. 4 and 6, the lower surface 20b of the die pad 20 is exposed from the sealing body 40 on a lower surface 40b side of the searing body 40. In the example illustrated in FIG. 4, the area of the lower surface 20b of the die pad 20 the same as or larger than the area of the lower surface 40b of the sealing body 40. Further, as illustrated in FIG. 3, a portion of the die pad 20 projects from one of side surfaces 40s of the sealing body 40 outward in plan view seen from the upper surface 20t side of the die pad 20. In addition, as illustrated in FIGS. 3 and 6, a portion of the upper surface 20t of the die pad 20 and a portion of the side surfaces 20s (at least the side surface 20s2) are exposed from the sealing body 40. By making the planar size of the die pad 20 large and exposing the portion of the die pad 20 from the sealing body 40 as in the present embodiment, it is possible to improve an efficiency of dissipating heat generated in the semiconductor chip 10.

Also, because the lower surface 20b of the die pad 20 coupled to the lead 30D that is an external terminal is exposed from the sealing body 40, the cross-sectional area of a conductive path in which a current flows can be increased. Therefore, an impedance in the conductive path can be reduced. In particular, this is preferable in that, when the lead 30D is an external terminal corresponding to an output node of a circuit included in the semiconductor device PKG1, a power loss in output wiring can be directly reduced by reducing an impedance component of the conductive path to which the lead 30D is coupled.

The die pad 20 includes a base member 21 that is formed of the same metal material as the leads 30, for example, copper (Cu) or an alloy material mainly containing copper (Cu). Each of the leads 30 includes a base member 31 that is formed of the same metal material as the die pad 20, for example, copper (Cu) or an alloy material mainly containing copper (Cu).

In addition, the thickness of the die pad 20 (the distance from one of the upper surface 20t and the lower surface 20b to the other) is larger than the thickness of the lead 30 (the distance from one of the upper surface 30t and a lower surface 30b to the other) in the example illustrated in FIG. 6. When the thickness of the die pad 20 is large as in the present embodiment, the heat capacity of the die pad 20 is large. Consequently, a property of heat dissipation of the semiconductor device PKG1 by the die pad 20 is improved.

The portion of the die pad 20, exposed from the sealing body 40 (the outer portion, the exposed portion) is covered with the metal film 22. Similarly, the portion of the lead 30, exposed from the sealing body 40 (the outer portion 30X) is covered with a metal film 32. The metal films 22 and 32 are for improving wettability of a solder material used as a coupling material when the semiconductor device PKG1 is mounted on a mounting substrate. The metal films 22 and 32 are plated metal films formed by electrolytic plating, for example. The metal films 22 and 32 are made of a solder material containing tin (Sn), for example, although the details will be described later.

The die bonding material (an adhesive) 11 illustrated in FIGS. 5 and 6 is a conductive member (a die bonding material) for fixing the semiconductor chip 10 onto the die pad 20 and electrically coupling the semiconductor chip 10 and the die pad 20 to each other. A solder material may be used as the die bonding material 11, for example. Alternatively, the die bonding material 11 may be a conductive resin adhesive containing a plurality of silver (Ag) particles (Ag fillers), that is, so-called silver (Ag) paste. A metal film (not illustrated) having higher adhesion to the die bonding material 11 than copper (Cu) or a copper alloy that is a base member of the die pad 20 may be formed on a portion of the upper surface 20t of the die pad 20, although illustration is omitted. With this metal film, an adhesion strength between the die bonding material 11 and the die pad 20 can be improved.

The gate electrode pad GE of the semiconductor chip 10 and the lead 30G are electrically coupled to each other via the wire 12 (more specifically, a wire 12G), as illustrated in FIG. 5. Similarly, the source electrode pad SE of the semiconductor chip 10 and the lead 30S are electrically coupled to each other via the wire (a conductive member, a metal line) 12 (more specifically, a wire 12S). The wire 12 is a conductive member connecting an electrode pad on the front surface 10t side of the semiconductor chip 10 and the lead 30 to each other, and mainly contains a metal such as aluminum (Al) copper (Cu), silver (Ag), or gold (Au), for example.

As illustrated in FIGS. 5 and 6, one end of the wire 12G is joined to the gate electrode pad GE of the semiconductor chip 10. Meanwhile, the other end of the wire 12G opposite to the above one end is joined to the upper surface 30t of a wire bonding portion (a pad, a bonding pad, a wire coupling portion, a bonding portion) 30W formed in a portion of the lead 30G.

Further, as illustrated in FIGS. 5 and 7, one end of the wire 12S is joined to the source electrode pad SE of the semiconductor chip 10. Meanwhile, the other end of the wire 12S opposite to the above one end is joined to the upper surface 30t of a wire bonding portion (a pad, a bonding pad, a wire coupling portion, a bonding portion) 30W formed in a portion of the lead 30S.

In a power semiconductor device, a larger current flows in a wiring path coupled to the source electrode pad SE than in a wiring path coupled to the gate electrode pad GE. Therefore, in the example illustrated in FIG. 5, the wire 12S is thicker than the wire 12G. The shape and the number of the wires 12 are not limited to those illustrated in FIG. 5, but can be changed in various ways. For example, the wire 12G and the wire 12S have the same thickness as each other. Also, the source electrode pad SE and the lead 30S may be electrically coupled to each other via a plurality of wires 12S, for example.

The semiconductor chip 10, the leads 30, and the wires 12 are sealed by the sealing body 40. The sealing body 40 is a resin body sealing the semiconductor chip 10, the leads 30, and the wires 12 and has an upper surface 40t (see FIGS. 3 and 6) and a lower surface (a mounting surface) 40b (see FIGS. 4, 6, and 7) located on the opposite side to the upper surface 40t. Further, as illustrated in FIGS. 3 and 4, each of the upper surface 40t (see FIG. 3) and the lower surface 40b (see FIG. 4) of the sealing body 40 includes a plurality of side surfaces 40s in its peripheral portions.

For example, the sealing body 40 is made mainly of a thermosetting resin, such as epoxy resin. In the present embodiment, filler particles, such as silica (silicon dioxide; $SiO_2$) particles, are mixed into a resin material in order to improve properties (for example, a property of expansion affected by heat) of the sealing body 40.

<Details of Lead>

As illustrated in FIGS. 6 to 8, each of the leads 30 of the present embodiment is provided with a metal film 33 on the lower surface 30b in the inner portion 30M. Meanwhile, no metal film is formed on the upper surface 30t in the inner portion 30M, which is on the opposite side to the portion where the metal film 33 is formed, and the base member 31 of the lead 30 is exposed. The reason why the metal film 33 is formed selectively on the lower surface 30b in the inner portion 30M of the lead 30 in this manner is described in detail.

For example, as illustrated in FIG. 6, the semiconductor chip 10, the wire 12, a portion of the die pad 20 (a portion of the upper surface 20t and the side surface 20s1), and the inner portion 30M of the lead 30 are sealed by the sealing body 40 that mainly contains a resin composition containing a thermosetting resin. The sealing body 40 is formed by supplying the resin into a molding die in which a lead frame is accommodated and thereafter performing a heat treatment (cure baking) to set a thermosetting resin component contained in the resin. At an interface at which the resin forming the sealing body 40 and each member of the semiconductor device PKG1 are in contact with each other, the resin is bonded to a surface of that member.

The sealing body 40 after being set and a metal member, such as the lead 30, are different in coefficient in linear expansion. Although filler particles, such as silica, are mixed into the sealing body 40 as described above to reduce a difference of the coefficient of linear expansion between the sealing body 40 and the semiconductor chip 10, a difference of the coefficient of linear expansion between the metal member an the sealing body 40 is relatively large. Therefore, a stress caused by the difference of linear expansion is larger around the bonding portion 30W between the wire 12G and the lead 30G than around a bonding portion between the electrode pad GE of the semiconductor chip 10 and the wire 12G illustrated in FIG. 6.

Even when there is the difference of the coefficient of linear expansion between the metal member and the sealing body 40, peeling at the bonding interface between the metal member and the sealing body 40 can be suppressed if a temperature applied to the semiconductor device PKG1 is within about 150° C., for example. However, semiconductor devices are being used in various fields nowadays and there is a demand for widening a range of a use environment temperature. In a case of a power semiconductor device as in the present embodiment, the demand for widening the range of the use environment temperature is particularly strong because a control circuit itself may be arranged in a harsh environment. The temperature range studied by the inventors of the present application is from about −55° C. to about 260° C. When the expected temperature range of the use environment becomes wider, stress (thermal stress) applied to the bonding interface between the metal member and the sealing body 40 caused by the difference of the coefficient of linear expansion becomes larger. Around an upper limit of the temperature range, the stress becomes large particularly.

Even when peeling occurs at the bonding interface between the metal member and the sealing body 40, reliability of the semiconductor device PKG1 is not always lowered immediately. For example, even when the peeling occurs in the vicinity of the bonding portion 30W between the wire 12 and the lead 30 illustrated in FIG. 6, disconnection between the wire 12 and the lead 30 does not always immediately occur. However, when the peeling occurs in the vicinity of the bonding portion 30W between the wire 12 and the lead 30, a stress caused by temperature cyclic loading applied to the semiconductor device PKG1 (a load in which a high-temperature state and a low-temperature state are alternately repeated) is repeatedly applied to the bonding portion between the wire 12 and the lead and its surrounding portion. During this application, in a case where a strength of bonding between the wire 12 and the lead 30 or a mechanical strength of a portion in which the wire 12 is bonded to the wire 30 is strong, coupling between the wire 12 and the lead 30 is maintained until a certain number of cycles (e.g., about 500 cycles).

However, in a case where the number of cycles of the temperature cyclic loading is increased (to 1000 cycles or more, for example) as a part of measures for improving the performance of the semiconductor device PKG1, a possibility that the portion where the wire 12 is bonded to the lead 30 is damaged increases. For example, when the wire 12 and the lead 30 are disconnected from each other, an open failure occurs. Also, when the portion of bonding is partly damaged but does not cause the disconnection, an impedance at the damaged portion becomes large, resulting in lowering of properties of a switching element.

Figure 9:
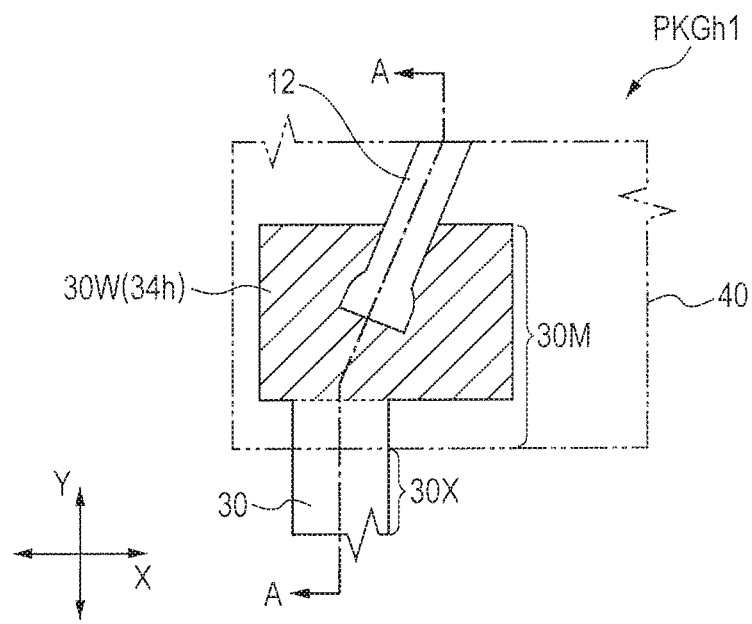
FIG. 9 is an enlarged plan view illustrating a coupling portion between a lead and a wire of a semiconductor device of a studied example for the embodiment, while the coupling portion is enlarged.
Figure 10:
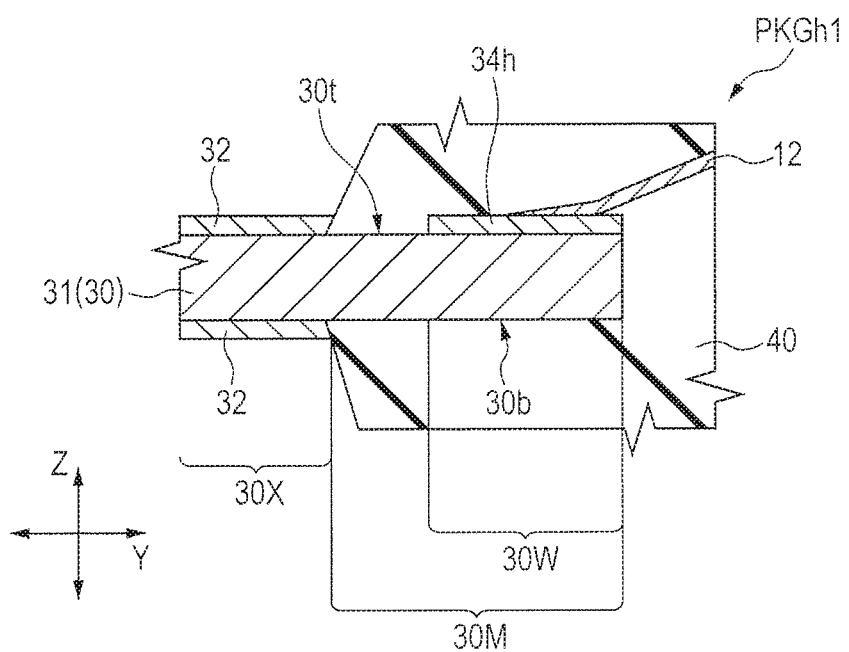
FIG. 10 is an enlarged cross-sectional view taken along line A-A in FIG. 9.

Therefore, the inventors of the present application has studied a technique for improving reliability of a semiconductor device, for example, a technique that can maintain electrical coupling in the semiconductor device also in the above-described harsh environment, as a part of measures for improving the performance of the semiconductor device. FIG. 9 is an enlarged plan view illustrating a coupling portion between a lead and a wire of a semiconductor device of a studied example with respect to the present embodiment, the portion being enlarged. FIG. 10 is an enlarged cross-sectional view taken along line A-A in FIG. 9. Although FIG. 9 is a plan view, hatching is added to a portion where a metal film 34h is formed in order to illustrate a range in which the metal film 34h is formed.

Figure 11:
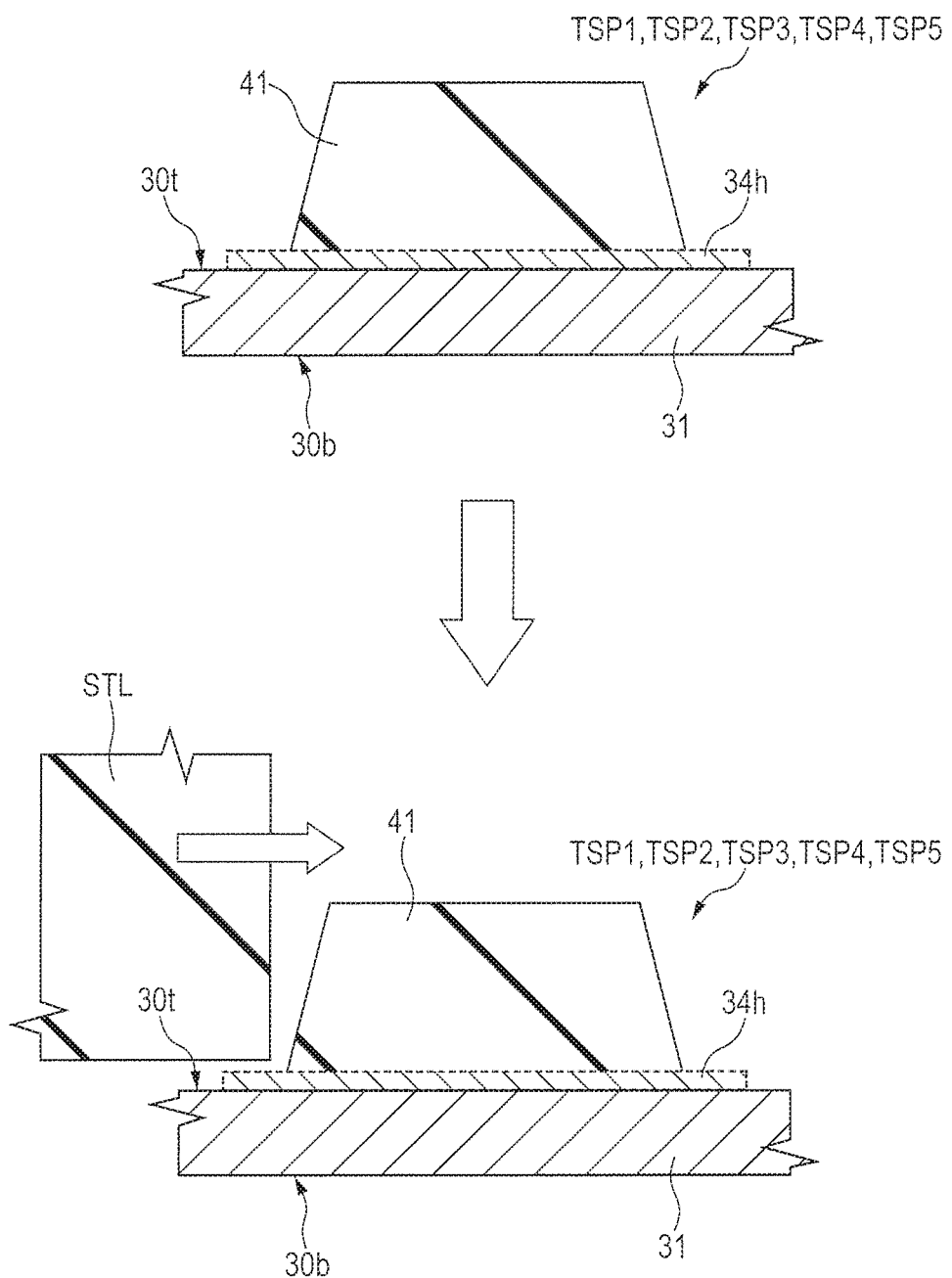
FIG. 11 schematically illustrates a method for measuring a bonding strength listed in Table 1.

First, the inventors has studied an embodiment in which the metal film 34h is arranged at bonding interface between the wire 12 and the lead 30, as in the semiconductor device PKGh1 that is a studied example illustrated in FIGS. 9 and 10, as a technique for improving a bonding strength between the wire 12 and the lead 30. The strength of bonding between the wire 12 and the lead 30 may be able to be improved by arranging the metal film 34h on the bonding interface. For example, in a case where the wire 12 is formed of aluminum (Al) and the base member 31 of the lead 30 is formed of copper (Cu), an intermetallic compound is generated on a boundary of a bonding interface between aluminum and copper. Meanwhile, in a case where a nickel (Ni) film (the metal film 34h) formed by electrolytic plating, for example, is formed on the upper surface 30t of the bonding portion 30W of the lead 30 as illustrated in FIG. 11, generation of the intermetallic compound can be suppressed on the bonding interface between the wire 12 and the metal film 34h. Therefore, by arranging the nickel film on the bonding interface between the wire 12 made of aluminum and the lead 30 made of copper 30, the bonding strength between the wire 12 and the lead 30 can be improved. Further, in a case where the wire 12 is made of gold (Au), for example, the bonding strength can be further improved by arranging the metal film 34h made of silver (Ag), gold, or the like, as compared with a case of bonding the wire 12 directly to the base member 31 of the lead 30 made of copper. When the bonding strength between the wire 12 and the lead 30 is improved in this manner, it is possible to increase the number of cycles until a coupling portion is damaged even if the lead 30 and the sealing body 40 peel from each other around the coupling portion.

However, in a case where entrance of moisture or impurities from the outside of the package is considered, when peeling occurs in the bonding portion 30W in the same surface as the upper surface 30t to which the wire 12 is bonded, the moisture or impurities entering from the outside can easily reach a portion to which the wire 12 is bonded. Therefore, from a viewpoint of suppressing corrosion of the portion of bonding between the wire 12 and the lead 30 caused by the moisture or impurities, it is preferable to suppress peeling between the sealing body 40 and the lead 30 in the upper surface 30t.

The inventors of the present application has focused on peeling between the lead 30 and the sealing body 40, and has found that, when a metal film is formed on a surface of the base material 31 of the lead 30, peeling can easily occur easily at a bonding interface between that metal film and the sealing body 40. The findings are described below, referring to Table 1 and FIG. 11. Table 1 illustrates a relation between a type of metal and a bonding strength that a bonding interface between a lead and a sealing body. FIG. 11 schematically illustrates a method for measuring the bonding strength in Table 1.

TABLE 1

| SAMPLE | TYPE OF METAL FILM | BONDING STRENGTH (%) |
| --- | --- | --- |
| TSP1 | NO METAL FILM (BASE MEMBER IS EXPOSED) | 100 |
| TSP2 | Ni (ELECTROLYTIC PLATING) | 6 |
| TSP3 | Ni—P (ELECTROLESS PLATING) UNMEASURABLE | 0 (UNMEASURABLE) |
| TSP4 | Ni/Pd/Au | 18 |
| TSP5 | Ag | 32 |

The bonding strengths in Table 1 represent measurement results of a shear test using samples TSP1 to TSP5 fabricated in the following method. As illustrated in FIG. 11, a resin body 41 was formed on the base member 31 that was a metal plate made of copper (Cu) via the metal film 34h (or not via the metal film 34h) to obtain samples TSP1 to TSP5. The resin body 41 is a resin containing a thermosetting resin and filler particles as with the sealing body 40 illustrated in FIG. 6, and is adjusted to make a difference of a coefficient of linear expansion from the semiconductor chip 10 smaller. A lower surface of the resin body 41 is square such that an area of contact between the resin body 41 and the metal film 34h (or the base member 31) is 10 mm². Sample TSP1 is obtained by performing degreasing and cleaning for the upper surface 30t of the base member 31 and then forming the resin body 41 directly on the upper surface 30t. Sample TSP2 is obtained by forming a nickel film (the metal film 34h) having a thickness of 1 µm by electrolytic plating on the upper surface 30t of the base member 31 and then forming the resin body 41 on the metal film 34h. Sample TSP3 is obtained by forming a nickel film (the metal film 34h) having a thickness of 1 µm on the upper surface 30t of the base member 31 by electroless plating and then forming the resin body 41 on the metal film 34h. Note that the nickel film formed by electroless plating contains 8% phosphorus (P). Therefore, this nickel film is represented as "Ni—P" in Table 1. Sample TSP4 is obtained by stacking a nickel film, a palladium (Pd) film, and a gold (Au) film in turn on the upper surface 30t of the base member 31 to form a lamination film (the metal film 34h) having a thickness of 1 µm and then forming the resin body 41 on the metal film 34h. Most of the thickness of 1 µm is the thickness of the nickel film. For example, the palladium film has a thickness of about 0.01 µm and the gold film has a thickness of about 0.15 µm. Sample TSP5 is obtained by forming a silver (Ag) film (the metal film 34h) having a thickness of 1 µm on the upper surface 30t of the base member 31 by plating and then forming the resin body 41 on the metal film 34h. Further, the resin body 41 formed on the metal film 34h was subjected to a heat treatment for 6 hours in the atmosphere at a temperature of 175° C. to be completely set, and was thereafter cooled to a normal temperature (25° C.).

Subsequently, in order to apply a load caused by a difference of a coefficient of linear expansion, a shear test was performed for each of Samples TSP1 to TSP5 by using a shear tool STL while each of Samples TSP1 to TSP5 is fixed to a heater block heated at a temperature of 260° C., so that a load when a bonding interface between the resin body 41 and the metal film 34h (or the base member 31) peels was measured. In Table 1, the load in the shear test for Sample TSP1 is assumed to 100%, and the loads in the shear tests for other samples are represented as ratios with respect to the load for Sample TSP1.

From the measurement results in Table 1, it was found that a bonding strength at a bonding interface between the resin body 41 (see FIG. 11) and a metal member is lowered in a case where the metal film 34h (see FIG. 11) was formed (Samples TSP2 to TSP5), as compared with a case where the metal film 34h was not formed (Sample TSP1). The bonding strength of each of Samples TSP2 to TSP5 is 32% or less, and can be considered to be less than a half of at least the bonding strength of the Sample TSP1 even when a measurement error is considered. In particular, in a case of the nickel film formed in each of Samples TSP2 and TSP3, the bonding strength was 10% or less with respect to Sample TSP1.

From the above test results, it was found that arranging the metal film 34h in the portion where the wire 12 and the lead 30 were bonded to each other as illustrated in FIGS. 9 and 10 might be able to improve the bonding strength between the wire 12 and the lead 30, but accelerated peeling between the lead 30 and the sealing body 40.

Here, the inventors has focused on the fact that when the metal film 34h is formed, peeling can occur easily at the interface between the metal film 34h and the sealing body 40, and has studied use of a metal film as a member for controlling an occurring position of peeling. In more detail, from a viewpoint of reducing stress applied to the bonding portion between the wire 12 and the lead 30, it suffices that occurrence of peeling is suppressed on the upper surface 30t side of the lead 30, onto which the wire 12 is bonded to the lead 30. In other words, even if peeling occurs in the lower surface 30b on the opposite side to the upper surface 30t, that peeling hardly causes application of stress to the portion where the wire 12 and the lead 30 are bonded to each other. Also, when entrance of moisture or impurities from the outside of a package is considered, the moisture or impurities can hardly reach the bonding portion between the wire 12 and the lead 30 even if peeling between the lead 30 and the sealing body 40 occurs on the lower surface 30b of the lead 30, because the lower surface 30b is a different surface from the bonding portion between the wire 12 and the lead 30.

Meanwhile, it is expected that an effect of suppressing peeling in the upper surface 30t can be provided by peeling of the bonding interface between the sealing body 40 and the lead 30 in the lower surface 30b of the lead 30. More specifically, peeling of the bonding interface between the lead 30 and the sealing body 40 is caused by stress applied to the bonding interface. When a portion of the bonding interface has peeled, the stress is distributed (lessened) in the peeling portion, so that an effect of reducing stress applied to a non-peeling portion is obtained. For example, when the bonding interface between the lead 30 and the sealing body 40 peels in the lower surface 30b of the lead 30, stress applied to the bonding interface on the upper surface 30t side can be reduced.

Figure 12:
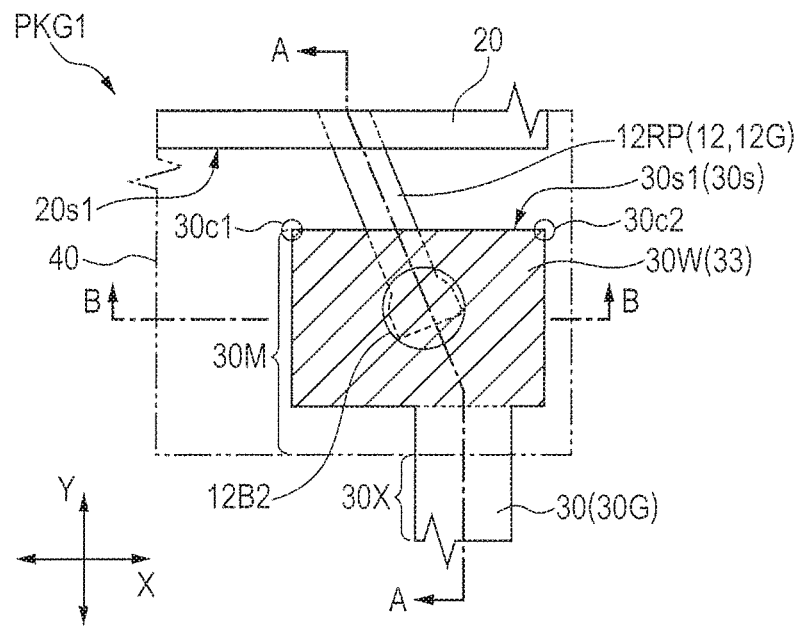
FIG. 12 is an enlarged plan view of a bonding portion between a lead serving as a gate terminal and a wire and its surrounding portion of the semiconductor device illustrated in FIG. 5, when seen from a lower surface side.
Figure 13:
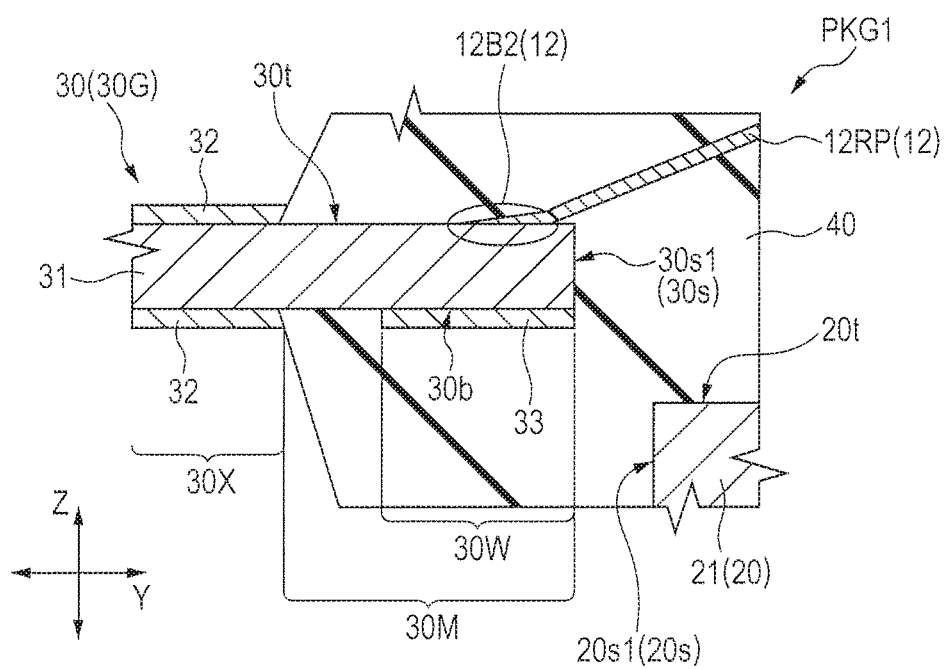
FIG. 13 is an enlarged cross-sectional view taken along line A-A in FIG. 12.
Figure 14:
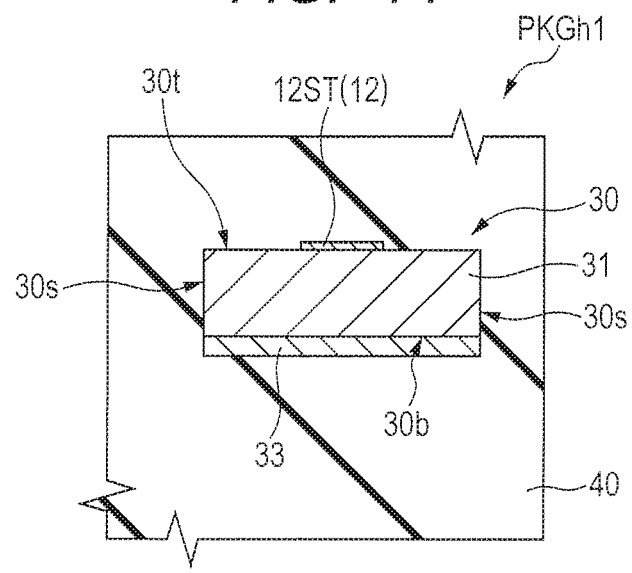
FIG. 14 is an enlarged cross-sectional view taken along line B-B in FIG. 12.
Figure 15:
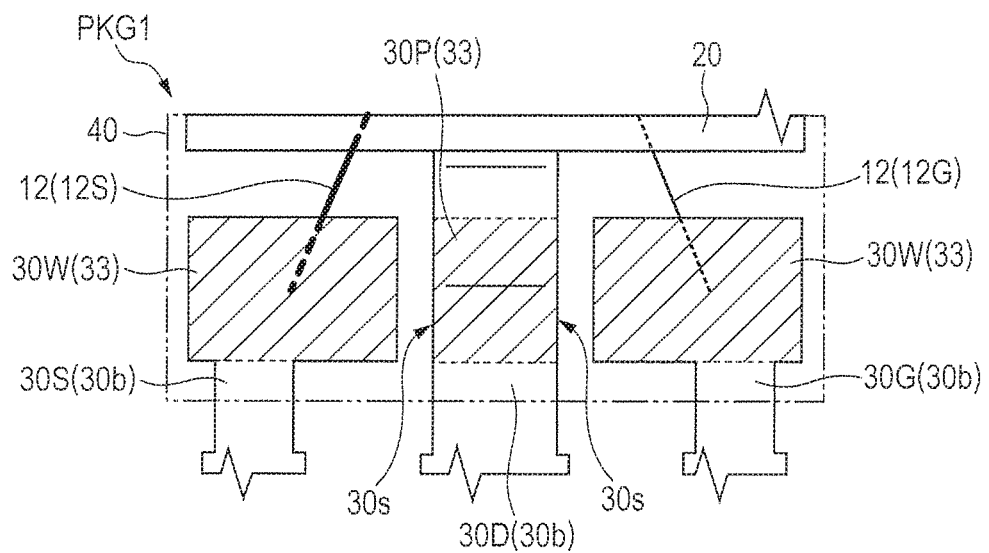
FIG. 15 is an enlarged plan view of a bonding portion between three leads and the wire and its surrounding portion of the semiconductor device illustrated in FIG. 5, when seen from a lower surface side.

Based on the above findings, the semiconductor device PKG1 of the present embodiment has a structure that can suppress peeling of the bonding interface between the sealing body 40 and the lead 30 on the upper surface 30t of the lead 30 by controlling an occurring position of peeling. FIG. 12 is an enlarged plan view of a bonding portion between a lead serving as a gate terminal and a wire and its surrounding portion, of the semiconductor device illustrated in FIG. 5, seen from a lower surface side. FIG. 13 is an enlarged cross-sectional view taken along line A-A in FIG. 12, and FIG. 14 is an enlarged cross-sectional view taken along line B-B in FIG. 12. FIG. 15 is an enlarged plan view of a bonding portion between three leads and wires and its surrounding portion, of the semiconductor device illustrated in FIG. 5, seen from the lower surface side. Although FIGS. 12 and 15 are plan views, hatching is added to a portion where the metal film 33 is formed (the wire bonding portion 30W or a portion 30P) in order to illustrate a range where the metal film 33 is formed. Also, an outline of a portion of the wire 12, hidden by the wire bonding portion 30W, is shown with broken line in FIGS. 12 and 15.

As illustrated in FIGS. 12 and 13, the upper surface 30t in the inner portion 30M of the lead 30G (see FIG. 13) and the lower surface 30b in the inner portion 30M of the lead 30G (see FIG. 13) are covered with the sealing body 40. The wire 12G is bonded to the upper surface 30t of the wire bonding portion 30W of the inner portion 30M of the lead 30G. The metal film 33 is formed on the lower surface 30b in the inner portion 30M of the lead 30G. The metal film 32 is formed on each of the upper surface 30t and the lower surface 30b in the outer portion 30X of the lead 30G. Further, no metal film is formed on the upper surface the wire bonding portion 30W of the inner portion 30M of the lead 30G. In the present embodiment, the base member 31 is exposed in the upper surface 30t in the entire wire bonding portion 30W, as illustrated in FIG. 5, and the wire 12 is bonded directly to the base member 31.

Based on the studied results described referring to Table 1, in the structure illustrated in FIGS. 12 and 13, the bonding strength between the sealing body 40 of the lead 30 in the upper surface 30t of the lead 30 is two times or more the bonding strength between the sealing body 40 and the lead 30 in the lower surface 30b of the lead 30 (see FIG. 13). In this case, the bonding interface between the lead 30 and the sealing body 40 can easily peel on the lower surface 30b of the lead 30. When peeling occurs on the lower surface 30b of the lead 30, stress is distributed by a peeling portion, so that stress applied to the bonding interface on the upper surface 30t side (see FIG. 13) is lessened. Consequently, peeling between the sealing body 40 and the lead 30 at the bonding interface on the upper surface 30t side can be suppressed, and therefore application of stress to the bonding interface between the wire 12 and the lead 30 can be suppressed. Further, if peeling between the sealing body 40 and the lead 30 can be suppressed on the upper surface 30t side of the lead 30, it is possible to block a path of entrance of moisture or impurities from the outside of the sealing body 40 into the upper surface 30t of the bonding portion 30W. Therefore, corrosion of the bonding interface between the wire 12 and the lead 30 and its surrounding portion can be suppressed. That is, according to the present embodiment, reliability of electrical coupling between the wire 12 and the lead 30 can be improved by causing peeling between the sealing body 40 and the lead 30 on the lower surface 30b side with priority.

Meanwhile, a portion (a side) in which the lower surface 30b and the side surface 30s (more specifically, each of two side surfaces 30s that extend along an extending direction of the lead 30 and are opposed to each other) of the lead 30 cross each other is an inflection point at which a surface-extending direction rapidly changes. While the lead 30 is patterned by removing a portion of a metal plate by metal stamping or etching, for example, a portion in which the surface-extending direction gently changes (a curved portion) is hardly formed in the portion (side) in which the lower surface 30b of the lead 30 and the side surface 30s cross each other. In other words, it can be regarded that substantially no curved portion is included in the portion in which the lower surface 30b of the lead 30 and the side surface 30s cross each other. In the following description, an inflection point at which the surface-extending direction rapidly changes and which can be regarded as including substantially no curved portion as illustrated in FIG. 14 is referred to as an edge portion. FIG. 14 explains an example of the edge portion in which the inflection point is formed, by using a cross-sectional view along X-direction. However, the edge portion is also formed in the side surface 30s other than the side surface 30s illustrated in FIG. 14. For example, an apical surface 30s1 illustrated in FIGS. 12 and 13 is formed by removing a portion of a metal plate by metal stamping or etching. Therefore, the edge portion is formed in a portion (a side) in which the lower surface 30b and the apical surface 30s1 cross each other.

In a case where peeling occurs in a portion on the lower surface 30b side, of the bonding interface between the sealing body 40 and the lead 30 (for example, at the bonding interface between the metal film 33 and the sealing body 40), when stress caused by temperature cyclic loading is applied to a portion of that peeling, the peeling portion gradually makes progress along the lower surface 30b. However, the edge portion is formed in the portion in which the lower surface 30b of the lead 30 and the side surface 30s cross each other, and the metal film 33 is not formed on the side surface 30s, as illustrated in FIG. 14. Therefore, progress of peeling hardly goes beyond the edge portion to reach the side surface 30s of the lead 30. Even if peeling reaches the side surface 30s, peeling further makes progress along the side surface 30s. However, because of the edge portion formed in a portion in which the side surface 30s and the upper surface 30t cross each other, peeling can hardly reach the upper surface 30t. Accordingly, even if peeling occurs on the lower surface 30b located on the opposite side to the upper surface 30t of the lead 30, peeling is less likely to reach the upper surface 30t.

In a case where the metal film 33 is formed before patterning the lead 30, the metal film 33 may adhere to a portion on the lower surface 30b side, of the side surface 30s, depending on a method of patterning the lead 30. However, unlike a case where the metal film 33 is continuously formed to cover the lower surface 30b and the side surface 30s entirely, progress of peeling to the side surface 30s can be suppressed even if the metal film 33 adheres to the portion on the lower surface 30b side, of the side surface 30s.

Further, the inner portion 30M may include a bent portion, as in the lead 30D illustrated in FIG. 8. In this case, progress speed of peeling can be lowered at the bent portion. However, in a case of the bent portion formed by bending like the lead 30D, the inflection point at which the surface-extending direction rapidly changes is hardly formed. Instead, the curved surface in which the surface-extending direction gently changes can be easily formed, as illustrated in FIG. 8 while being enlarged. Therefore, the bent portion has a smaller effect of suppressing progress of peeling, as compared with the edge portion formed in the portion in which the lower surface 30b and the side surface 30s of the lead 30 cross each other, illustrated in FIG. 14.

Next, a preferred embodiment of a position where the metal film 33 is formed is described. First, it is necessary that the metal film 33 is formed in at least a portion of the inner portion 30M illustrated in FIG. 12 from a viewpoint of controlling a portion where peeling between the sealing body 40 and the lead 30 occurs. Further, from a viewpoint of causing peeling to occur on the lower surface 30b of the lead 30 (see FIG. 13) with priority, it is necessary that the metal film 33 is formed on the lower surface 30b.

In addition, from a viewpoint of reducing stress in the vicinity a portion where the wire 12 is bonded to the lead 30, it is preferable that at least a portion of the metal film 33 is formed on the lower surface 30b in the wire bonding portion 30W of the inner portion 30M.

Furthermore, from a viewpoint of making occurrence of peeling on the lower surface 30b in the wire bonding portion 30W easier, it is preferable that the metal film 33 is formed on a portion of the lower surface 30b in the wire bonding portion 30W, onto which stress (thermal stress) caused by difference of linear expansion between the lead 30 and the sealing body 40 can easily concentrate. For example, in a case where the planar shape of the wire bonding portion 30W is a quadrangle having a larger width than an extending portion (a portion extending in Y-direction) of the lead 30, as illustrated in FIG. 12, thermal stress can easily concentrate to each corner of the quadrangle. In particular, thermal stress can easily concentrate on corners 30c1 and 30c2 (see FIG. 12) located in an apical portion of the lead 30 in the extending direction (Y-direction). Therefore, it is preferable that the metal film 33 is formed on at least one (preferably both of) the corners 30c1 and 30c2.

In the semiconductor device PKG1, as illustrated in FIG. 12, the wire bonding portion 30W of the lead 30G includes the apical surface 30s1 of the inner portion 30M, which is located on the opposite side to a boundary portion between the inner portion 30M and the outer portion 30X. The lower surface 30*b* in the wire bonding portion 30W of the lead 30G has the corners 30*c*1 and 30*c*2 crossing the apical surface 30*s*1. The metal film 33 is formed on at least one (both in the example of FIG. 12) of the corners 30*c*1 and 30*c*2. That is, the metal film 33 is formed on a portion of the lower surface 30*b* of the wire bonding portion 30W, onto which thermal stress can particularly concentrate. Therefore, peeling can easily occur on the lower surface 30*b* in the wire bonding portion 30W. Consequently, stress applied to the upper surface 30*t* of the wire bonding portion 30W (see FIG. 13) can be easily reduced.

The above-described corner is defines as follows. In a case where sides constituting a peripheral portion of the lower surface 30*b* in the wire bonding portion 30W extend straight and two of the sides cross each other at an end of each side, as in the example of FIG. 12, a crossing of the two sides crossing each other is a corner. Further, in a case where the crossing of the sides constituting the peripheral portion of the lower surface 30*b* in the wire bonding portion 30W is chamfered, that chamfered portion is a corner.

In a modified example with respect to the example illustrated in FIGS. 12 and 13, the base member 31 may he exposed in a portion of the lower surface 30*b* in the wire bonding portion 30W without the metal film 33. However, the metal film 33 is formed on the lower surface 30*b* in the wire bonding portion 30W entirely in the present embodiment. In a structure in which the metal film 33 is formed on a portion of the lower surface 30*b* of the lead 30 but is not formed on the other portion, as in the present embodiment, plating is performed while the portion without the metal film 33 is covered with mask. When the mask is formed in a portion of the wire bonding portion 30W, the area of the metal film 33 may become smaller, depending on a process accuracy (a positional accuracy) of the mask. Meanwhile, when the metal film 33 is formed on the lower surface 30*b* in the wire bonding portion 30W entirely, as in the present embodiment, processing can he easily performed because it is not necessary to improve an accuracy of a position where the metal film 33 is formed.

Further, in the semiconductor device PKG1 of the present embodiment, the metal film 33 is not formed on the lower surface 30*b* of the lead 30 in a portion of the inner portion 30M between the wire bonding portion 30W and the outer portion 30X. Instead, the base member 31 is in contact with the sealing body 40 there. In a modified example with respect to the example of FIG. 13, the metal film 33 is formed to cover the entire lower surface 30*b* of the inner portion 30M. For example, in a case where the metal film 33 illustrated in FIG. 13 is a lamination film of a nickel film, a palladium film, and a gold film, represented as Ni/Pd/Au in Table 1, this lamination film is favorable in solder wettability and therefore can be also used as the metal film 32. In this case, a manufacturing efficiency is better when the above lamination film is formed on the entire lower surface 30*b* including the inner portion 30M and the outer portion 30X and on the entire top surface 30*t* of the outer portion 30X (and the side surface of the outer portion 30X) while the upper surface 30*t* of the inner portion 30M is covered with mask than when the above lamination film is formed in the inner portion 30M and in the outer portion 30X of the lead 30 independently of each other. Therefore, a metal film (the above-described lamination film) is formed on the lower surface 30*b* to extend across the boundary between the inner portion 30M and the outer portion 30X. When peeling occurs at a portion of the bonding interface between the metal film 33 and the sealing body 40, peeling makes progress in the bonding interface between the metal film 33 and the sealing body 40 along the same surface as a surface on which peeling occurs. Therefore, in a case where the metal film 33 is formed to cover the entire lower surface 30*b* of the inner portion 30M, the lower surface 30*b* of the wire bonding portion 30W peel with high probability even when peeling occurs in any portion on the lower surface 30*b* side. Accordingly, thermal stress applied to the upper surface 30*t* of the wire bonding portion 30W can be lessened.

However, in that case, the entire lower surface 30*b* of the lead leads to the outside of the sealing body 40. Therefore, when moisture or impurities enter(s) from the outside of the sealing body 40, the moisture or impurities can easily reach the lower surface 30*b* of the wire bonding portion. Because the lower surface 30*b* is the surface on the opposite to the upper surface 30*t* to which the wire 12 is bonded as described above, the moisture or the like can hardly reach the upper surface 30*t* side even when the moisture or the like reaches the lower surface 30*b* of the wire bonding portion. However, from a viewpoint of suppressing corrosion of the lead 30 on the lower surface 30*b* side, it is preferable to block a path of entrance of the moisture or the like from the outside by joining the base member 31 of the lead 30 and the sealing body 40 on a portion of the lower surface 30*b*. Note that even if the base member 31 of the lead 30 and the sealing body 40 are originally joined to each other on the portion of the lower surface 30*b*, peeling occurring at the bonding interface between the metal film 33 and the sealing body 40 may make progress to cause the bonding interface between the base member 31 and the sealing body 40 later, so that coupling between them is released and they are placed in a state where they are in simple contact with each other.

Next, a material for the metal film 33 is described. As described with reference to Table 1 and FIG. 11, the bonding strength between the metal film 34*h* and the sealing body 40 is lowered, as compared with the bonding strength between the base member 31 and the sealing body 40. This is the same in a case where the metal film 34*h* and the base member 31 are made the same metal material (e.g., copper). However, from a viewpoint of increasing a difference of the bonding strength between the upper surface 30*t* of the lead 30 and the lower surface 30*b*, it is preferable that the metal film 33 is made of a different metal material from the metal material (e.g., copper or a copper alloy) forming the base member 31 of the lead 30. In particular, a nickel film (in a case of electrolytic plating and in a case of electroless plating) among the metal materials listed in Table 1 as examples is particularly weak (small) in strength of bonding with the sealing body 40, and is therefore preferable in that the occurring position of peeling can be easily controlled.

Next, a lead 30 among a plurality of leads 30 illustrated in FIG. 5 is described, which is more suitable for application of the method for controlling the occurring position of peeling between the sealing body 40 and the lead 30 by employing a structure in which the metal film 33 is formed on the lower surface 30*b* side and the bonding interface between the metal film 33 and the sealing body 40 can peel more easily than on the upper surface 30*t* side. In the following description, the method for controlling the occurring position of peeling in the above-described manner is referred to a peeling control method of the present embodiment. The peeling control method also includes the various modified examples (including the preferred embodiment) already described and various modified examples (including a preferred embodiment) described later. First, the wires 12 are respectively coupled to the lead 30G and the lead 30S of the leads 30, as illustrated in FIG. 5. Each of the lead 30G and the lead 30S is spaced apart from the die pad 20. Therefore, the wire 12 is employed as a conductive path electrically connecting the semiconductor chip 10 and each of the leads 30G and 30S to each other. Meanwhile, the lead 30D is electrically coupled to the drain electrode DE of the semiconductor chip 10 (see FIG. 8) via the die pad 20, because the lead 30D is integrally formed with the die pad 20. Therefore, no wire is coupled to the lead 30D. However, in a case where the lead 30D and an electrode (not illustrated) formed on a surface of the semiconductor chip 10 are electrically coupled to each other, the wire 12 may be coupled to the lead 30.

In a case where the leads 30 include both a lead 30 to which the wire 12 is coupled and a lead 30 to which the wire 12 is not coupled simultaneously, it is preferable to apply the above-described peeling control method of the present embodiment to the leads 30G and 30S to each of which the wire 12 is coupled. In the present embodiment, as described with reference to FIGS. 12 and 13, the metal film 33 is formed on the lower surface 30b of the lead 30G, while but not formed on the upper surface 30t in the wire bonding portion 30W. Therefore, reliability of a portion where the wire 12G and the lead 30G are electrically coupled to each other can be improved.

Further, as illustrated in FIG. 7, in the wire bonding portion 30W of the lead 30S, the metal film 33 is formed on the lower surface 30b, while but not formed on the upper surface 30t. Therefore, reliability of a portion where the wire 12S and the lead 30S are electrically coupled to each other can be improved. As illustrated in FIG. 5, the lead 30S is arranged on the opposite side to the lead 30G with the lead 30D interposed therebetween in X-direction, and the lead 30G and the lead 30S are symmetrical in shape about a line. Further, the lead 30S is different from the lead 30G in that the lead 30S is coupled to the source electrode pad SE of the semiconductor chip 10 via the wire 12S. In addition, the wire 12S coupled to the lead 30S is different from the wire 12G in that the wire 12S is thicker in line diameter (more specifically, a diameter of an extending portion that extends in a direction connecting an electrode pad of the semiconductor chip 10 and the wire bonding portion 30W of the lead 30 to each other) than the wire 12G. In a case where the wire 12 is coupled to each of the leads 30 and the thus coupled wires 12 are different from each other in line diameter in this manner, the wire 12 having a relatively thinner line diameter can be easily damaged. Therefore, when the above-described peeling control method of the present embodiment is applied to either the lead 30G or the lead 30S, it is preferable to apply it to the lead 30G that is relatively thinner in line diameter of the coupled wire 12. However, the wire 12S is a conductive path through which a large current flows, and therefore may cause lowering of electric characteristics when a portion of the bonding portion between the wire 12S and the lead 30S in such a conductive path is damaged. Therefore, it is preferable that the lead 30S also has the same structure as the lead 30G as in the present embodiment. In more detail, the lead 30S has the upper surface 30t that is a surface on the same side as the upper surface 30t of the lead 30 (see FIG. 6) and the lower surface 30b that is on the opposite side to the upper surface 30t. The upper surface 30t in the inner portion 30M of the lead 30S and the lower surface 30b in the inner portion 30M of the lead 30S are covered with the sealing body 40. The wire 12S is bonded to the upper surface 30t of the wire bonding portion 30W of the inner portion 30M of the lead 30S. On the lower surface 30b in the inner portion 30M of the lead 30S, the metal film 33 is formed. No metal film is formed on the upper surface 30t in the wire bonding portion 30W of the inner portion 30M of the lead 30.

Except for the above differences, the lead 30S has the same structure as the lead 30G. Also, a preferable position and a preferable material of the metal film 33 described with respect to the lead 30G can be also applied to the lead 30S in the same manner. Therefore, redundant description is omitted.

Further, a lead bonding portion (a bonding portion) 12B2 of the wire 12, which is bonded to the wire bonding portion 30W of the lead 30, is deformed by a load applied by a bonding tool to be flat, as illustrated in FIGS. 12 and 13, for example, although details thereof will be described later. A portion that is deformed to be flat and thinner than the line diameter of the wire in this manner is referred to as a stitch portion. As illustrated in FIG. 13, the thickness of the lead bonding portion 12B2 of the wire 12 is smaller than the line diameter (the thickness in a direction perpendicular to the extending direction) of an extending portion 12RP of the wire 12 in a thickness direction of the lead 30 (that is a direction from one of the upper surface 30t and the lower surface 30b to the other and is Z-direction illustrated in FIG. 13). Because the thickness of the wire 12 is thin in the lead bonding portion 12B2 in this manner, the wire 12 can be easily damaged in a thinner portion when stress concentrates on the lead bonding portion 12B2. The lead bonding portion 12B2 may be broken depending on the degree of the damage. Accordingly, in a case where of performing wire bonding for the portion where the lead 30 and the wire 12 are bonded to each other such that a flat portion such as the stitch portion is formed, it is preferable to apply the above-described peeling control method of the present embodiment.

The extending portion 12RP of the wire 12 is defined as follows. As illustrated in FIGS. 6 and 7, the wire 12 includes an electrode bonding portion 12B1 (see FIG. 24 described later) to be bonded to an electrode on the front surface lot side, of the semiconductor chip 10 (the gate electrode pad GE illustrated in FIG. 6 or the source electrode pad SE illustrated in FIG. 7). The wire 12 also has the lead bonding portion 12B2 to be bonded to the wire bonding portion 30W of the lead 30. Further, the wire 12 has the extending portion 12RP (see FIG. 13) that extends from one of the electrode bonding portion and the lead bonding portion to the other.

As described above, no wire is coupled to the lead 30D. Therefore, it is unnecessary to suppress damage of the bonding portion between the wire and the lead. Accordingly, in a modified example with respect to the present embodiment, the metal film 33 is not formed on the lower surface 30b in the inner portion 30M of the lead 30D illustrated in FIG. 8. In this case, it is likely that peeling occurs at the bonding interface between the sealing body 40 and the lead 30D at any position in the inner portion 30M of the lead 30D. However, even when peeling occurs at the bonding interface between the sealing body 40 and the lead 30D, that peeling has almost no effect on the reliability of the coupling portion between the lead 30 and the wire 12 illustrated in FIG. 5, because no wire is coupled to the lead 30D. In addition, when peeling occurs at the bonding interface between the metal film 33 and the sealing body 40, peeling makes progress along the same surface as the surface in which peeling occurs, as decried above. Further, while the lead 30D illustrated in FIG. 8 has a bent portion, the bent portion formed by bending has a smaller effect of suppressing progress of peeling, as compared with the above-described edge portion. Therefore, in a case where the metal film 33 is formed on the lower surface 30b of the lead 30D, for example, when peeling occurs at the bonding interface between the metal film 33 and the sealing body 40, peeling makes progress along the lower surface 30b and can easily reach the boundary between the inner portion 30M and the outer portion 30X or the side surface 20s1 of the die pad 20. Further, the side surface 20s1 of the die pad 20 is continuous with the lower surface 20b that is exposed from the sealing body 40. In this case, because a path is formed that communicates with the outside of the sealing body 40 at both ends and extends along the lower surface 30b of the lead 30D, moisture or impurities can easily enter from the outside. From a viewpoint of suppressing formation of such a path, it is preferable that the metal film 33 is not formed. Further, in a case where the metal film 33 is not formed in the lead 30D, the number of components to be sealed inside the sealing body 40 can be reduced, as compared with the semiconductor device PKG1.

Meanwhile, in the present embodiment, the metal film 33 is formed on the lower surface 30b in the inner portion 30M of the lead 30D, whereas but not formed on the upper surface 30t located on the opposite side to the metal film 33 so that the base member 31 is exposed, as illustrated in FIG. 8. In more detail, the lead 30D has the upper surface 30t that is on the same side as the upper surface 20t of the die pad 20 and the lower surface 30b that is on the opposite side to the upper surface 30t. The upper surface 30t and the lower surface 30b in the inner portion 30M of the lead 30D are covered with the sealing body 40. Further, the lead 30D includes a portion 30P located between the wire bonding portion 30W of the lead 30G and the wire bonding portion 30W of the lead 30S in a plan view, as illustrated in FIG. 15. The metal film 33 is formed on the lower surface 30b in the portion 30P of the lead 30D, whereas but not formed on the upper surface 30t in the portion 30P of the inner portion 30M of the lead 30D, as illustrated in FIG. 8.

In this case, peeling can easily occur at the bonding interface between the metal film 33 and the sealing body 40, as described above. When peeling occurs at the bonding interface between the metal film 33 and the sealing body 40, an effect is obtained that stress is distributed (lessened) at a peeling portion and stress applied to a non-peeling portion is reduced, in a case where thermal stress is further applied to the bonding interface between the sealing body 40 and the lead 30D. Therefore, stress applied to the upper surface 30t side is lessened at the peeling portion on the lower surface 30b side.

As described with reference to FIG. 14, an edge portion is formed in a portion where the lower surface 30b of the lead 30D and the side surface 30s thereof cross each other, and the metal film 33 is not formed on the side surface 30s. Therefore, progress of peeling hardly goes beyond the edge portion to reach the side surface 30s of the lead 30. Even if peeling reaches the side surface 30s, peeling further makes progress along the side surface 30s. However, peeling hardly reaches the upper surface 30t because the edge portion is formed in a portion where the side surface 30s and the upper surface 30t cross each other. Therefore, even if peeling occurs on the lower surface 30b located on the opposite side to the upper surface 30t of the lead 30, it is less likely that peeling reaches the upper surface 30t.

In this manner, it is possible to suppress peeling between the lead 30D and the sealing body 40 on the upper surface 30t of the lead 30D according to the present embodiment. As illustrated in FIG. 8, the upper surface 30t of the lead 30D and the upper surface 20t of the die pad 20 are continuous with each other and, when peeling occurs in the upper surface 30t of the lead 30D, peeling may make progress along the upper surface 30t to reach the upper surface 20t of the die pad 20. The semiconductor chip 10 is bonded and fixed to the upper surface 20t of the die pad 20 via the die bonding material 11, and it is preferable that peeling does not reach an interface of adhesion between the semiconductor chip 10 and the die pad 20. Because the semiconductor device PKG1 of the present embodiment can suppress occurrence of peeling on the upper surface 30t of the lead 30D that is continuous with the upper surface 20t of the die pad 20, as described above, it is possible to suppress progress of the peeling to reach the upper surface 20t of the die pad 20.

<Manufacturing Method of Semiconductor Device>

Figure 16:
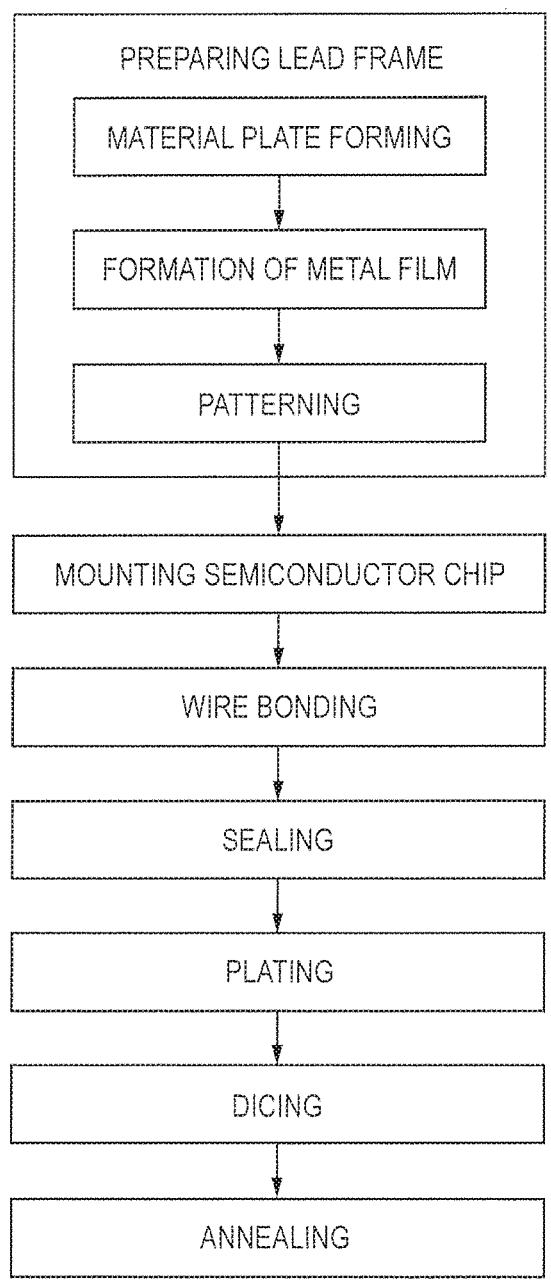
FIG. 16 illustrates an outline of manufacturing steps of the semiconductor device explained referring to FIGS. 1 to 15.

Next, manufacturing steps of the semiconductor device PKG1 described with reference to FIGS. 1 to 18 are described. The semiconductor device PKG1 is manufactured in accordance with a flow illustrated in FIG. 16. FIG. 16 is an explanatory view illustrating an outline of the manufacturing steps of the semiconductor device described with reference to FIGS. 1 to 15.

<Lead Frame Preparing Step>

Figure 17:
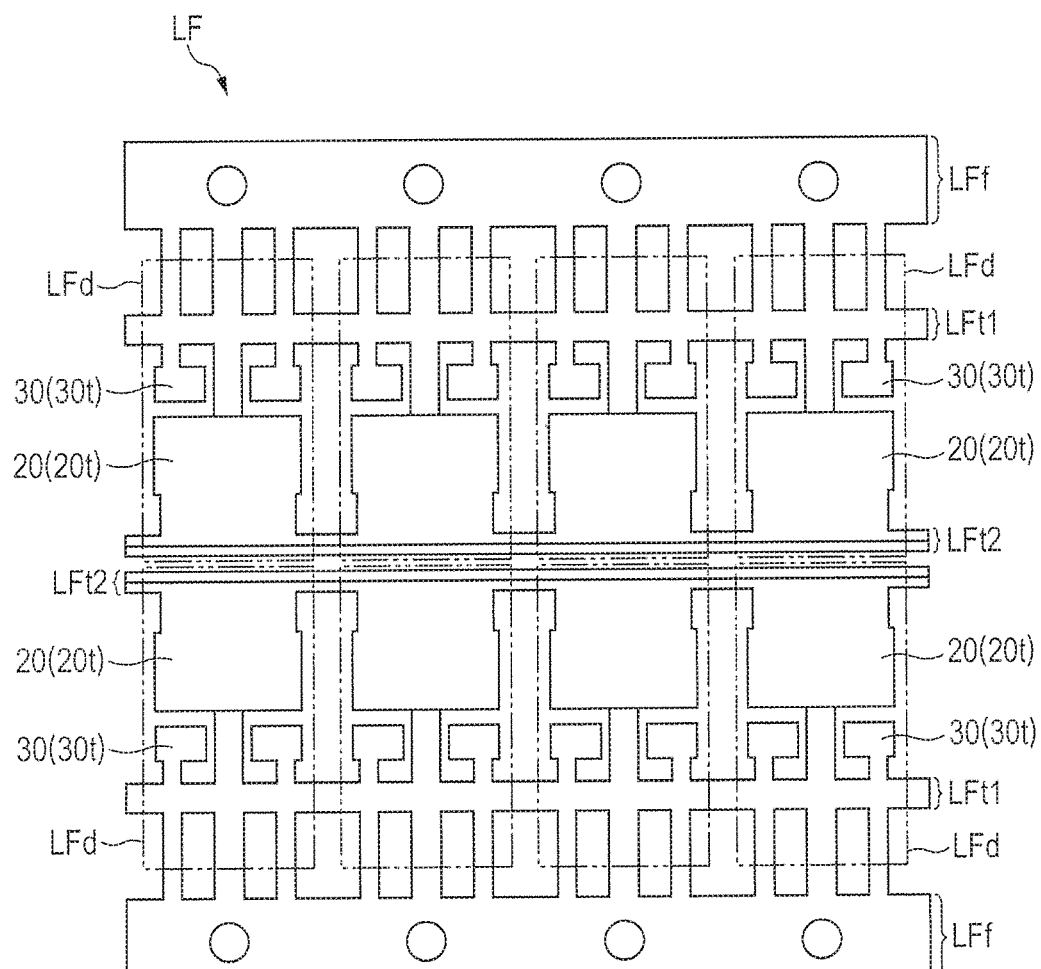
FIG. 17 is an enlarged plan view illustrating a portion of a lead frame prepared in a lead frame preparing step illustrated in FIG. 16.
Figure 18:
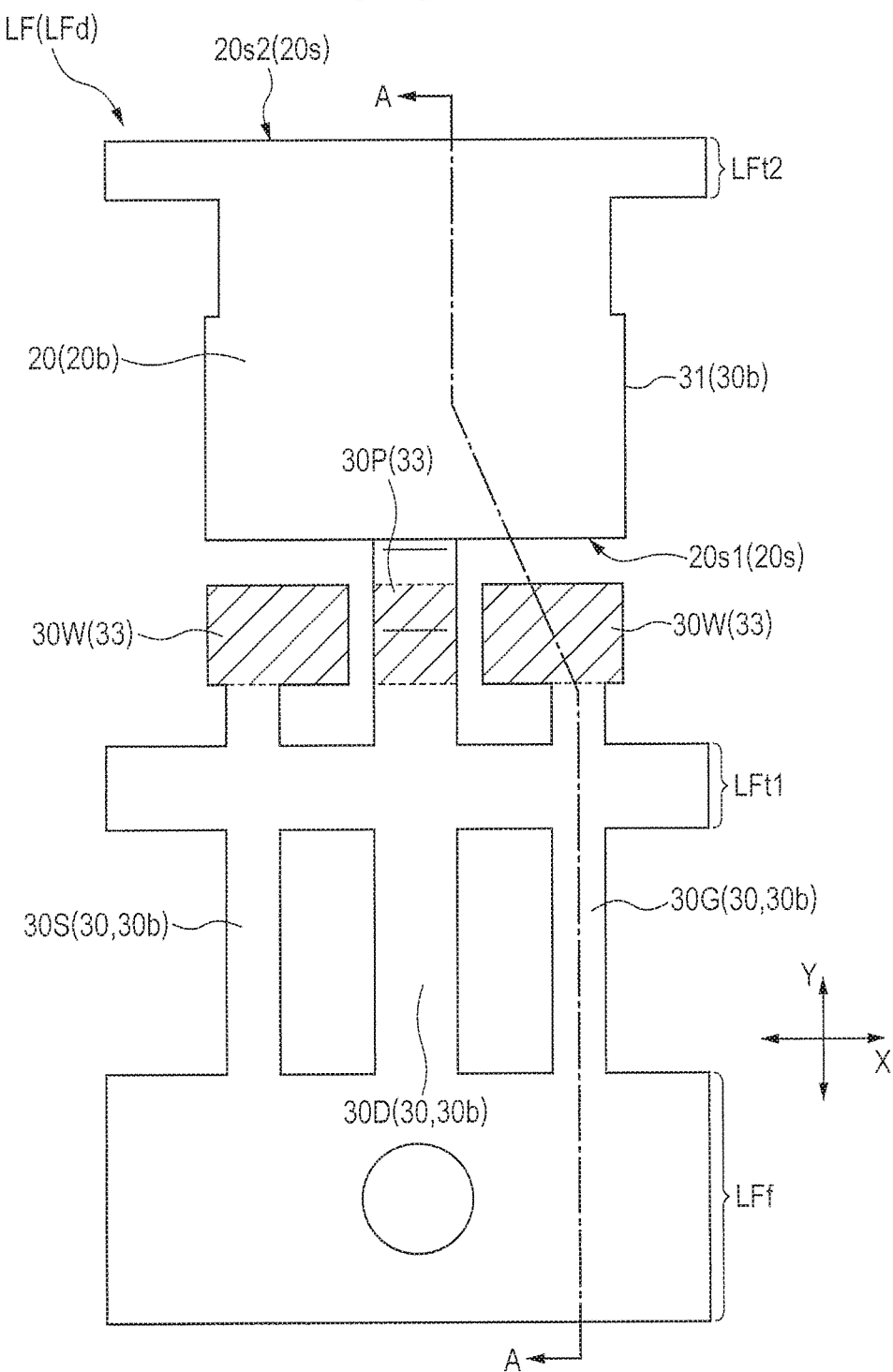
FIG. 18 is an enlarged plan view of one of device forming portions illustrated in FIG. 17, when seen from a lower surface side.
Figure 19:
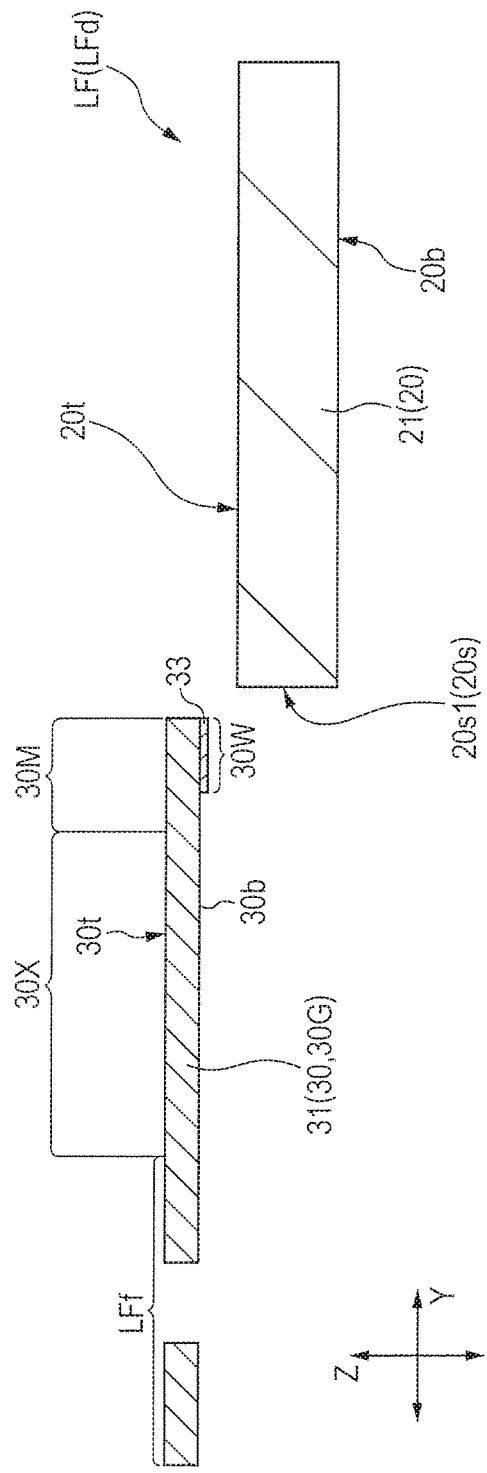
FIG. 19 is an enlarged cross-sectional view taken along line A-A in FIG. 18.
Figure 20:
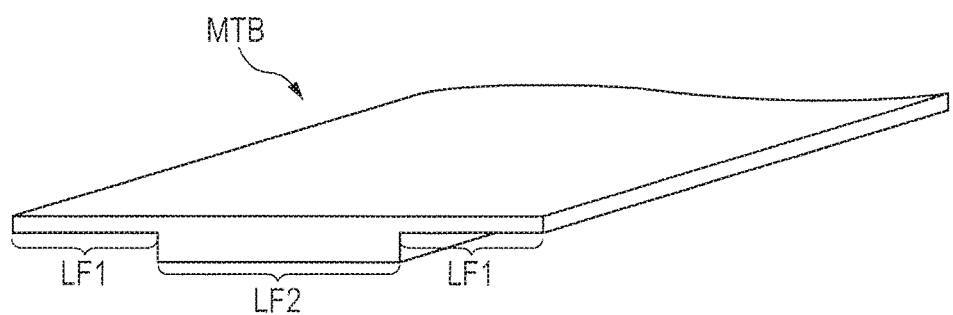
FIG. 20 is an enlarged perspective view illustrating an example of a state where a material plate is shaped by metal stamping in a material plate forming step illustrated in FIG. 16.
Figure 21:
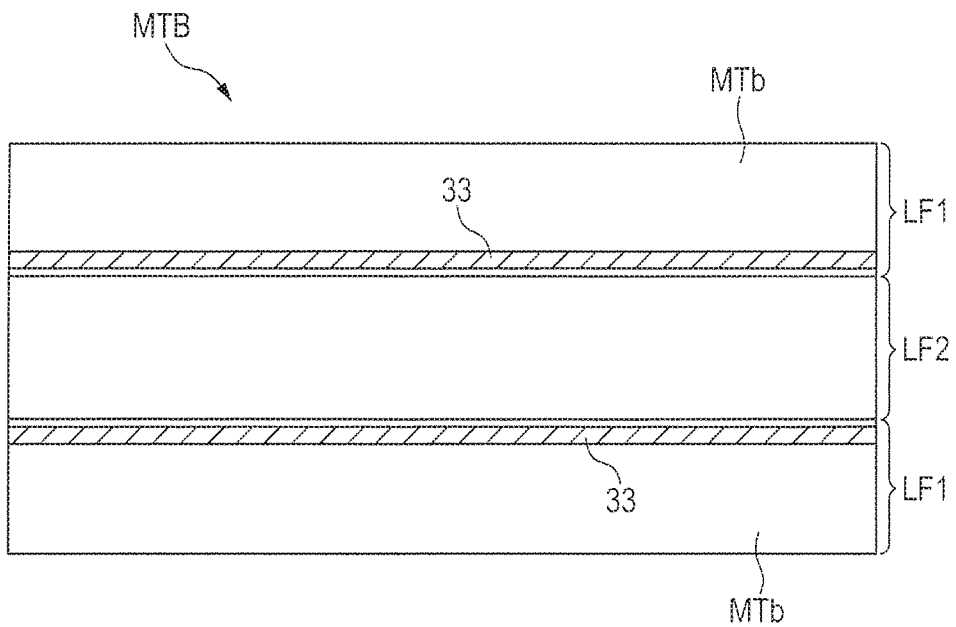
FIG. 21 is an enlarged plan view illustrating a state where a metal film is formed on a portion of the material plate on its lower surface side in a metal film forming step illustrated in FIG. 16.
Figure 22:
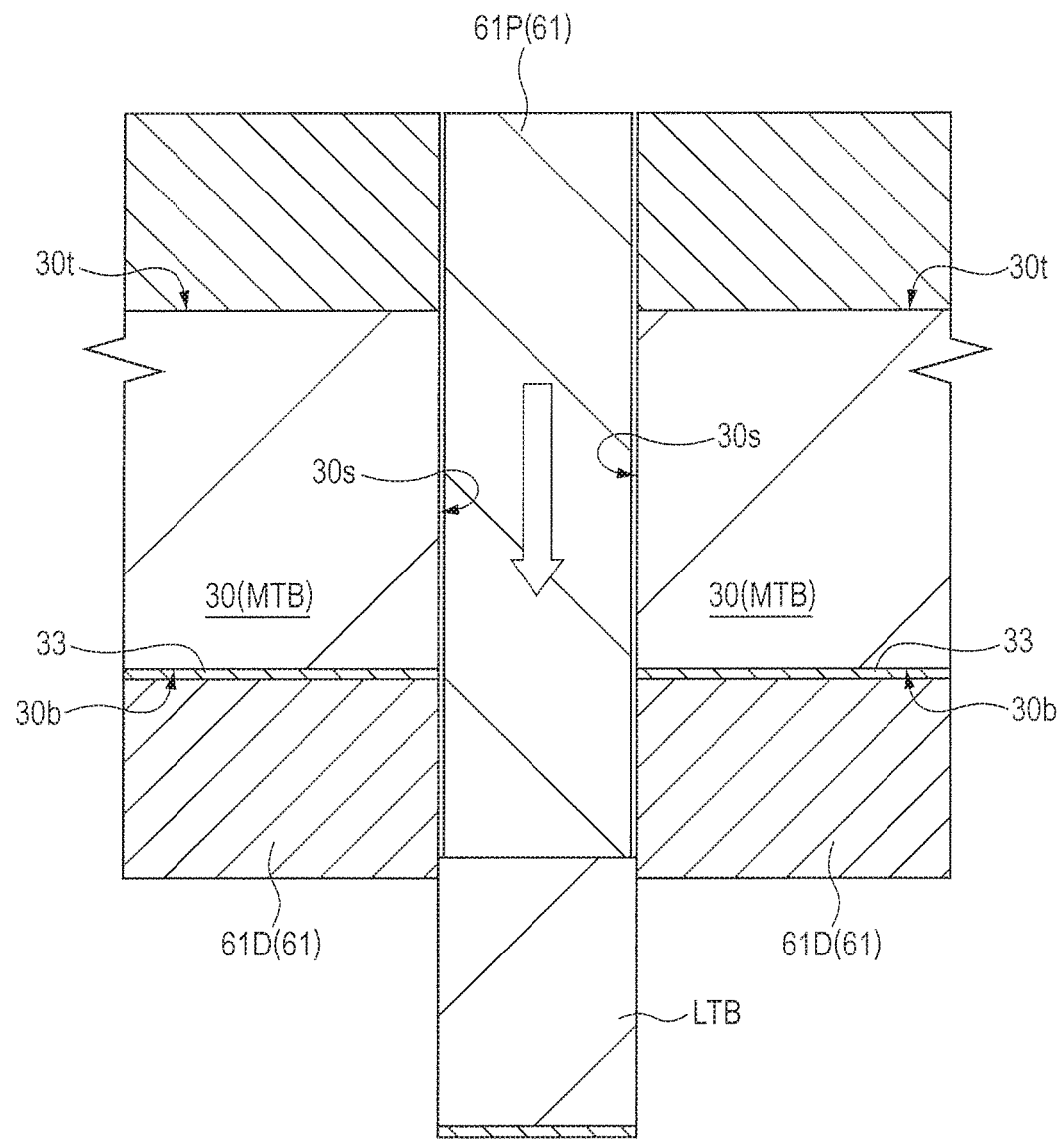
FIG. 22 is an enlarged cross-sectional view illustrating a state where a portion of the material plate is removed by metal stamping in a patterning step illustrated in FIG. 16.

First, in a lead frame preparing step illustrated in FIG. 16, a lead frame LF illustrated in FIGS. 17 to 19 is prepared. FIG. 17 is an enlarged plan view illustrating a portion of the lead frame to be prepared in the lead frame preparing step illustrated in FIG. 16. FIG. 18 is an enlarged plan view of one of device forming portions illustrated in FIG. 17, seen from a lower surface side. FIG. 19 is an enlarged cross-sectional view, taken along line A-A in FIG. 18. FIG. 20 is an enlarged perspective view illustrating an example of a state where a material plate is shaped by metal stamping in a material plate forming step illustrated in FIG. 16. FIG. 21 is an enlarged plan view illustrating a state where a metal film is formed on a portion of the material plate on its lower surface side in a metal film forming step illustrated in FIG. 16. FIG. 22 is an enlarged cross-sectional view illustrating a state where a portion of the material plate is removed in a patterning step illustrated in FIG. 16 by metal stamping.

As illustrated in FIG. 17, the lead frame LF prepared in this step includes a plurality of device forming portions LFd coupled to a frame (a frame portion) LFf. FIG. 17 illustrates 8 device forming portions LFd. The device forming portions LFd each corresponds to one semiconductor device PKG1 illustrated in FIG. 5. The lead frame LF is a base member for multiple pieces in which a plurality of device forming portions LFd are arranged in a matrix. Use of the lead frame LF including the device forming portions LFd in this manner enables a plurality of semiconductor devices PKG1. (see FIG. 3) to be manufactured at once, and therefore a manufacturing efficiency can be improved. Although FIG. 17 illustrates an example in which two rows of the device forming portions LFd, in each of which the device forming portions LFd are arranged in X-direction, are lined up, the number of rows of the device forming portions LFd can be modified in various ways. For example, one row or three or more rows may be lined up. However, an arrangement of two rows is preferable as illustrated in FIG. 17, considering easiness of shaping a material plate (see FIG. 20) MTB.

The lead frame LF is formed of a metal material mainly containing copper (Cu), for example. The thickness of a portion of the die pad 20 is about 400 μm to about 2 mm, for example, and the thickness of the other portion is about 125 μm to about 400 μm.

Each of the device forming portions LFd is coupled to the frame LFf. The frame LFf is a support portion that supports each of members formed in the device forming portion LFd until a lead separating step illustrated in FIG. 16.

As illustrated in FIGS. 18 and 19, the die pad 20 and the leads 30 illustrated in FIGS. 5 to 8 are formed in the device forming portion LFd. The die pad 20 is coupled to the frame LFf via one of the leads 30 and is supported by the frame LFf. The leads 30 are each coupled to the frame LFf to be supported by the frame LFf.

The leads 30 are mutually coupled via a tie bar LFt1. Further, in the example illustrated in FIGS. 17 and 18, the die pads 20 are mutually coupled via a tie bar LFt2. The tie bar LFt2 is arranged at an end of the device forming portion LFd, which is on the opposite side to the leads 30, and includes a side surface 20s2 on the opposite side to the side surface 20s1 facing the leads 30 as illustrated in FIG. 18.

As illustrated in FIGS. 18 and 19, the metal film 33 is formed in advance on the lower surface 30b of the lead 30 included in the lead frame LF prepared in this step. As illustrated in FIG. 18, the metal film 33 is selectively formed on the wire bonding portion 30W and the portion 30P of the lower surface 30b, but is not formed in the other portion. Further, as illustrated in FIG. 19, the metal film 32 is not formed on the upper surface 30t and the lower surface 30b of the lead 30 included in the lead frame LF prepared in this step. Instead, the base member 31 is exposed there. On the upper surface 20t and the lower surface 20b of the die pad 20 included in the lead frame LF prepared in this step, the metal film 22 is not formed and the base member 21 is exposed.

The lead frame LF illustrated in FIGS. 17 to 19 is manufactured, for example, in the following manner. In the material plate forming step illustrated in FIG. 16, a metal material is shaped to form the material plate MTB having a plurality of portions that are different in thickness, as illustrated in FIG. 20. The material plate MTB includes a portion LF1 having a relatively thin thickness and a portion LF2 that is thinner than the portion LF1. The thickness of the portion LF1 corresponds to the thickness of the base member 31 of the lead 30 illustrated in FIG. 6. The thickness of the portion LF2 corresponds to the thickness of the base member 21 of the die pad 20 illustrated in FIG. 6. However, in a stage in which the material plate forming step is completed, it is not necessary that the thickness of the portion LF1 and the thickness of the base member 31 of the lead 30 correspond to each other and the thickness of the portion LF2 and the thickness of the base member 21 of the die pad 20 correspond to each other.

As a method for forming the portion LF1 and the portion LF2 of the material plate MTB, rolling or metal stamping or both rolling and metal stamping for a metal material can be used, for example.

Next, the metal film forming step illustrated in FIG. 16, plating is performed for a portion of the material plate MTB illustrated in FIG. 20 to form the metal film 33 on the portion of the material plate MTB as illustrated in FIG. 21. The metal film 33 is selectively formed on a portion of a lower surface MTb corresponding to the lower surface 30b (see FIG. 19) of the lead 30 (see FIG. 19), as illustrated in FIG. 21. In this step, plating is performed while a portion where the metal film 33 is not formed is covered with mask (not illustrated). As plating, a method in which the material plate MTB is immersed in a plating solution to cause deposition of the metal film 33 or a method in which the plating solution is sprayed onto a portion exposed from the mask to cause deposition of the metal film 33 can be applied. Further, in a case of immersing the material plate MTB in the plating solution, electroplating (electrolytic plating) may be applied in which a current is made to flow while an anode electrode and a cathode electrode are immersed in the plating solution (an electrolytic solution), thereby causing deposition of the metal film on a surface of the cathode electrode. In this case, by using the material plate MTB as the cathode electrode, the metal film 33 is deposited on the portion of the material plate MTB, which is exposed from the mask.

In a case of performing the metal film forming step before the patterning step as illustrated in FIG. 16, plating is performed while the side surface 30s illustrated in FIG. 15 is not exposed. Therefore, the shape of the portion covered with the mask during plating can be simplified. Further, it is possible to prevent the metal film 33 from being formed on the side surface 30s. Therefore, even when peeling between the sealing body 40 and the metal film 33 occurs on the lower surface 30b side of the lead 30, it is possible to suppress progress of peeling to reach the side surface 30s, as described with reference to FIG. 14.

Next, in the patterning step illustrated in FIG. 16, the material plate MTB illustrated in FIG. 21 is patterned to form the lead frame LF illustrated in FIG. 17. In the patterning step, the material plate MTB is patterned by removing a portion thereof, so that portions including the die pad 20, the leads 30, the frame LFf, the tie bars LFt1 and LFt2, and the like illustrated in FIG. 18 have predetermined shapes as illustrated in FIGS. 17 to 19. As a method for removing the portion of the material plate MTB, metal stamping, etching, or a combination of them may be used.

Further, in the example of the patterning step described in the present embodiment, the portion of the material plate MTB is removed by metal stamping, by using a die 61 (a cutting die) formed by a punch 61P and a die 61D as illustrated in FIG. 22 as an example. In this removal, a small curved surface may be formed in a portion where the side surface 30s and the upper surface 30t or the lower surface 30b that is continuous with the side surface 30s cross each other, because of a clearance of the punch 61P and the die 61D. For example, in a case where the punch 61P is pressed from the upper surface 30t side of the lead 30 to the lower surface 30b side, as illustrated in FIG. 22, a small curved surface may be formed in a boundary between the side surface 30s and the upper surface 30t. To the contrary, in a case where the punch 61P is pressed from the lower surface 30b side of the lead 30 to the upper surface 30t side, a small curved surface may be formed in an end portion on the side surface 30s side, of the metal film 33.

However, according to the studies by the inventors, a radius of curvature of the curved surface that is formed because of the clearance during metal stamping in this manner is several microns, and it can be regarded that there is substantially no curved surface, from a viewpoint of suppressing progress of peeling. In other words, by this step, an edge portion is formed in each of the portion where the lower surface 30b and the side surface 30s cross each other and the portion where the upper surface 30t and the side surface 30s cross each other.

<Semiconductor Chip Mounting Step>

Figure 23:
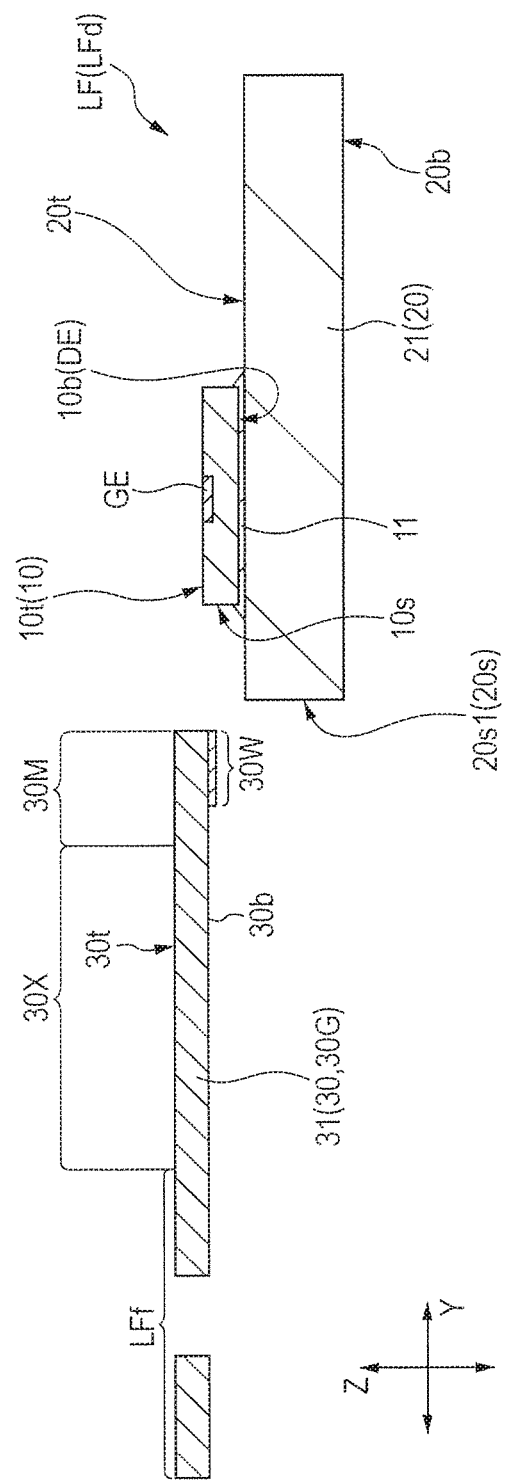
FIG. 23 is an enlarged cross-sectional view illustrating a state in which a semiconductor chip is mounted on a die pad illustrated in FIG. 19.

Next, in a semiconductor chip mounting step illustrated in FIG. 16, the semiconductor chip 10 is mounted on the die pad 20 of the lead frame LF, as illustrated in FIG. 23. FIG. 23 is an enlarged cross-sectional view illustrating a state in which the semiconductor chip is mounted on the die pad illustrated in FIG. 19.

In this step, the semiconductor chip 10 is mounted, (is bonded and fixed) on the upper surface 20t of the die pad 20 integrally formed with the lead 30D (see FIG. 8) that is a drain terminal, via the die bonding material 11. The semiconductor chip 10 is bonded and fixed such that the back surface 10b with the drain electrode DE formed thereon is opposed to the upper surface 20t of the die pad 20, which is a chip mounting surface, via the die boding material 11. In this manner, the drain electrode DE of the semiconductor chip 10 is electrically coupled to the die pad 20 via the die bonding material 11 that is a conductive coupling material.

In this step, the die bonding material 11 is applied onto the upper surface 20t of the die pad 20, and thereafter the semiconductor chip 10 is mounted on the die bonding material 11. By hardening the die bonding material, the semiconductor chip 10 and the die pad 20 are fixed to each other.

As the die bonding material 11, a solder material may be used, for example. Alternatively, the die bonding material 11 may be a conductive resin adhesive that is so-called silver (Ag) paste containing a plurality of silver (Ag) particles (Ag fillers) therein. In a case where the die bonding material 11 is a solder material, a reflow process is performed as a method for hardening the die bonding material. In a case where the die bonding material 11 is a conductive resin adhesive, a thermosetting resin component contained in the die bonding material 11 is heated to be set.

<Wire Bonding Step>

Figure 24:
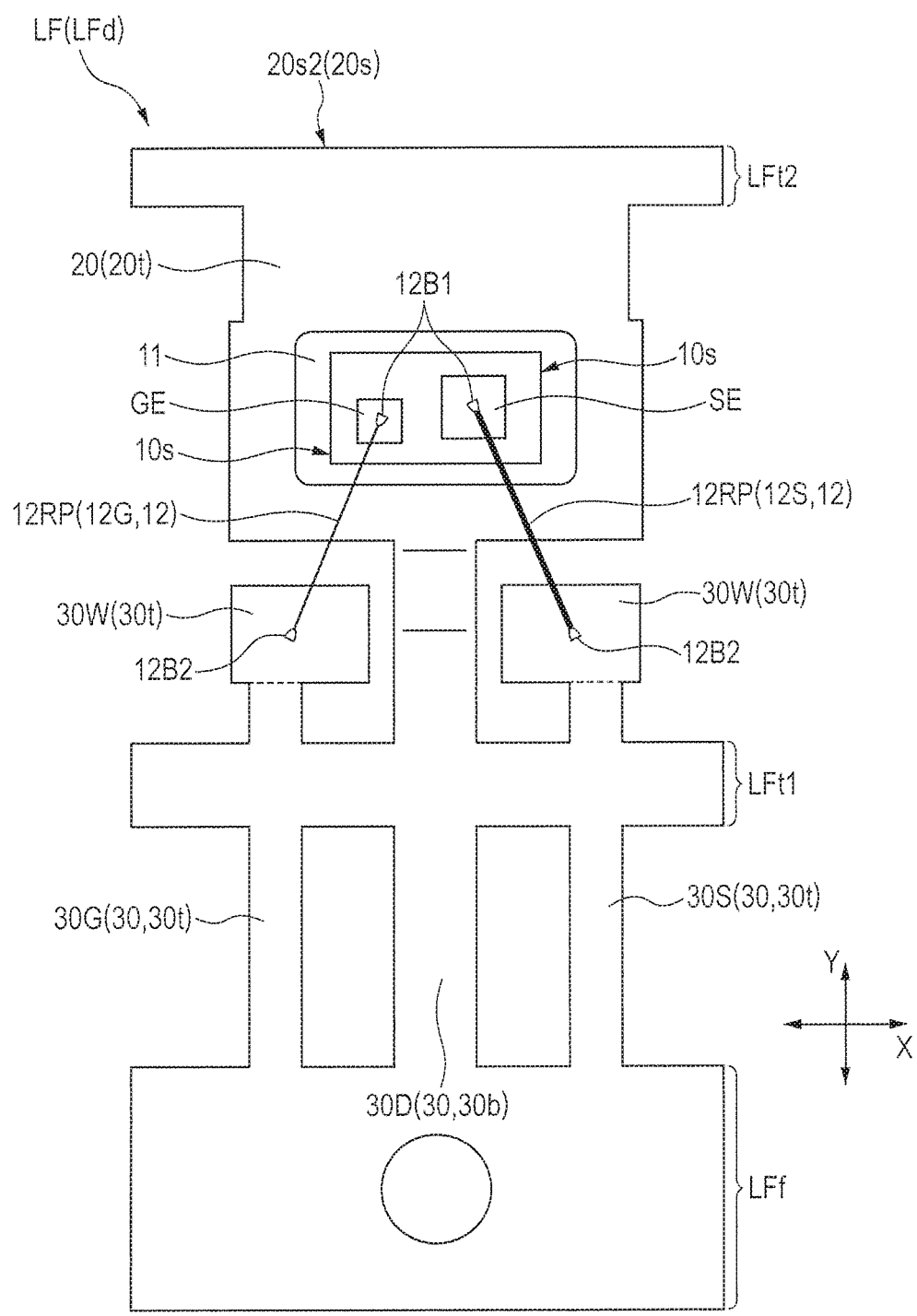
FIG. 24 is an enlarged plan view illustrating a state in which the semiconductor chip illustrated in FIG. 23 and the leads are electrically coupled to each other via wires.

Next, in a wire bonding step illustrated in FIG. 16, a plurality of electrode pads (the gate electrode pad GE and the source electrode pad SE) of the semiconductor chip 10 and the leads 30 are electrically coupled via the wires (metal wires) 12, respectively, as illustrated in FIG. 24. FIG. 24 is an enlarged plan view illustrating a state in which the semiconductor chip illustrated in FIG. 23 and the leads are electrically coupled to each other via the wires.

In this step, the gate electrode pad GE of the semiconductor chip 10 and the lead 30G are electrically coupled to each other via the wire 12G. Also, the source electrode pad SE of the semiconductor chip 10 and the lead 30S are electrically coupled to each other via the wire 12S in this step. In the example illustrated in FIG. 24, the line diameter of the wire 12S is thicker than that of the wire 12G. This enables the cross-sectional area of a wiring path coupled to the source electrode pad SE to be made larger. However, the thickness of the wires 12 may be the same. Alternatively, the source electrode pad SE of the semiconductor chip 10 and the lead 30S may be electrically coupled to each other via a plurality of wires 12S.

Various modified examples can be applied to a method of coupling the wire 12. In the present embodiment, the wire 12 made of aluminum is bonded by using a bonding tool called a wedge tool. In the wire bonding step using the wedge tool, the above-described stitch portion is formed on each of the first bonding side (in the electrode bonding portion 12B1 in the example of FIG. 24) and on the second bonding side (in the lead bonding portion 12B2 in the example of FIG. 24).

For example, in the step of bonding the wire 12 and the lead 30 to each other, a load is applied to the wire 12 by the bonding tool in a direction towards the lead 30, while the wire 12 is interposed between the bonding tool and the lead 30. In this application, heat or an ultrasonic wave may be applied to the bonding portion between the wire 12 and the lead 30 and its surrounding portion, in addition to the load. Thus, the wire 12 and the lead 30 are crimped. In a case where the stitch bonding portion is formed, the wire 12 is deformed to be flat when the load is applied to the wire 12. Therefore, the stitch portion is formed.

In a modified example of the present embodiment, a ball bonding method may be used, in which a tip of the wire is heated to be melted to form a ball portion and the ball portion is bonded to a member to be bonded (the elect rode pad or the lead) by using a bonding tool called a capillary, although illustration is omitted. In a case of the ball bonding method, the ball portion after being bonded can be made thicker, and therefore a mechanical strength of the bonding portion can be improved. However, even in the ball bonding method, the stitch portion is formed on the second bonding side (for example, the lead bonding portion 12B2 illustrated in FIG. 24) The bonding method in which the stitch portion is formed may be called a stitch bonding method.

In a case of using a wire made of aluminum (an aluminum wire) as in the present embodiment, it is more difficult to form the ball portion at the tip of the wire, as compared with a gold wire. Therefore, a wedge bonding method is applied. Accordingly, both the electrode bonding portion 12B1 and the lead bonding portion 12B2 each have the stitch portion formed therein, as schematically illustrated in FIG. 24.

<Sealing Step>

Figure 25:
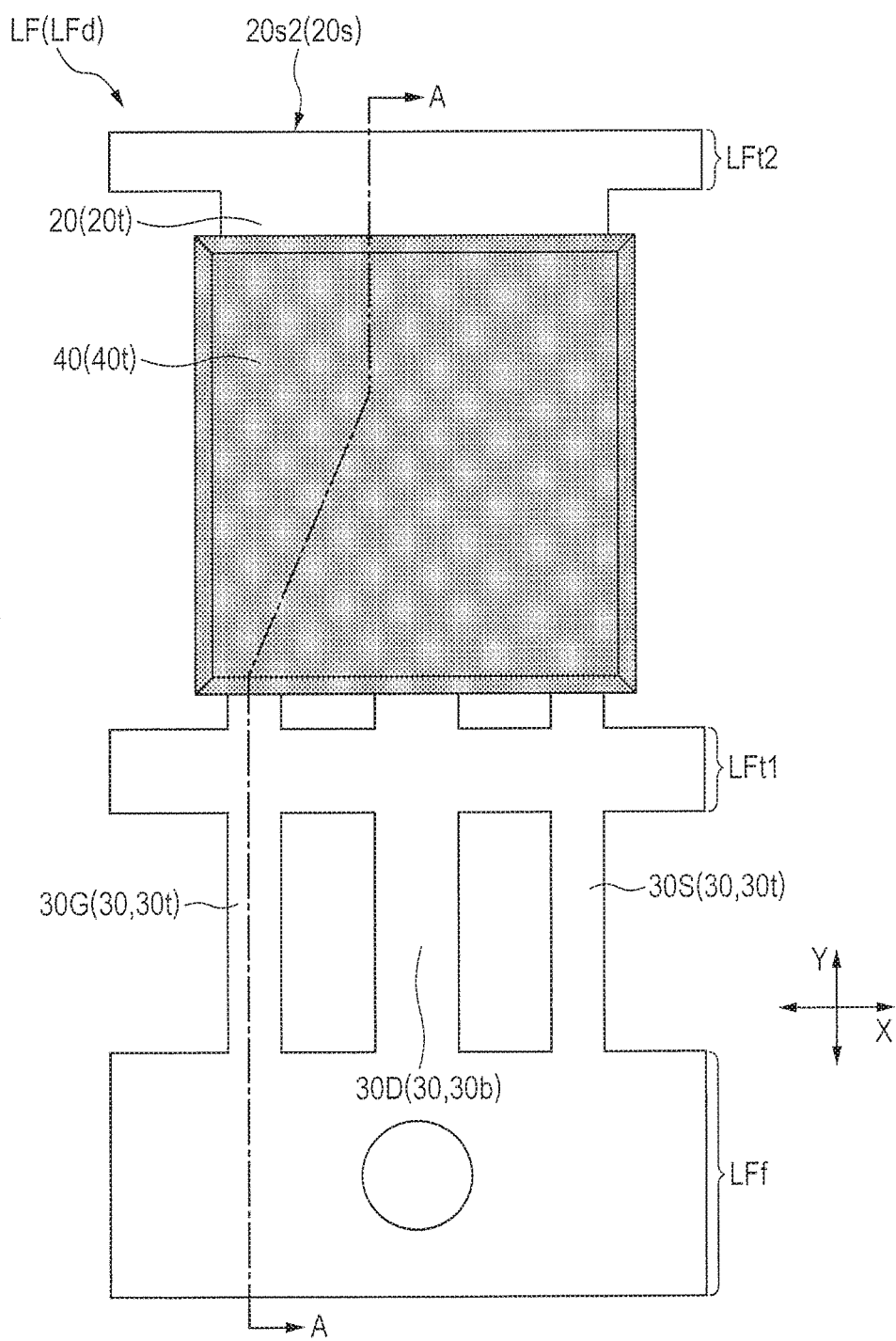
FIG. 25 is an enlarged plan view illustrating a state where a sealing body sealing the semiconductor chip illustrated in FIG. 24 and the wires is formed.
Figure 26:
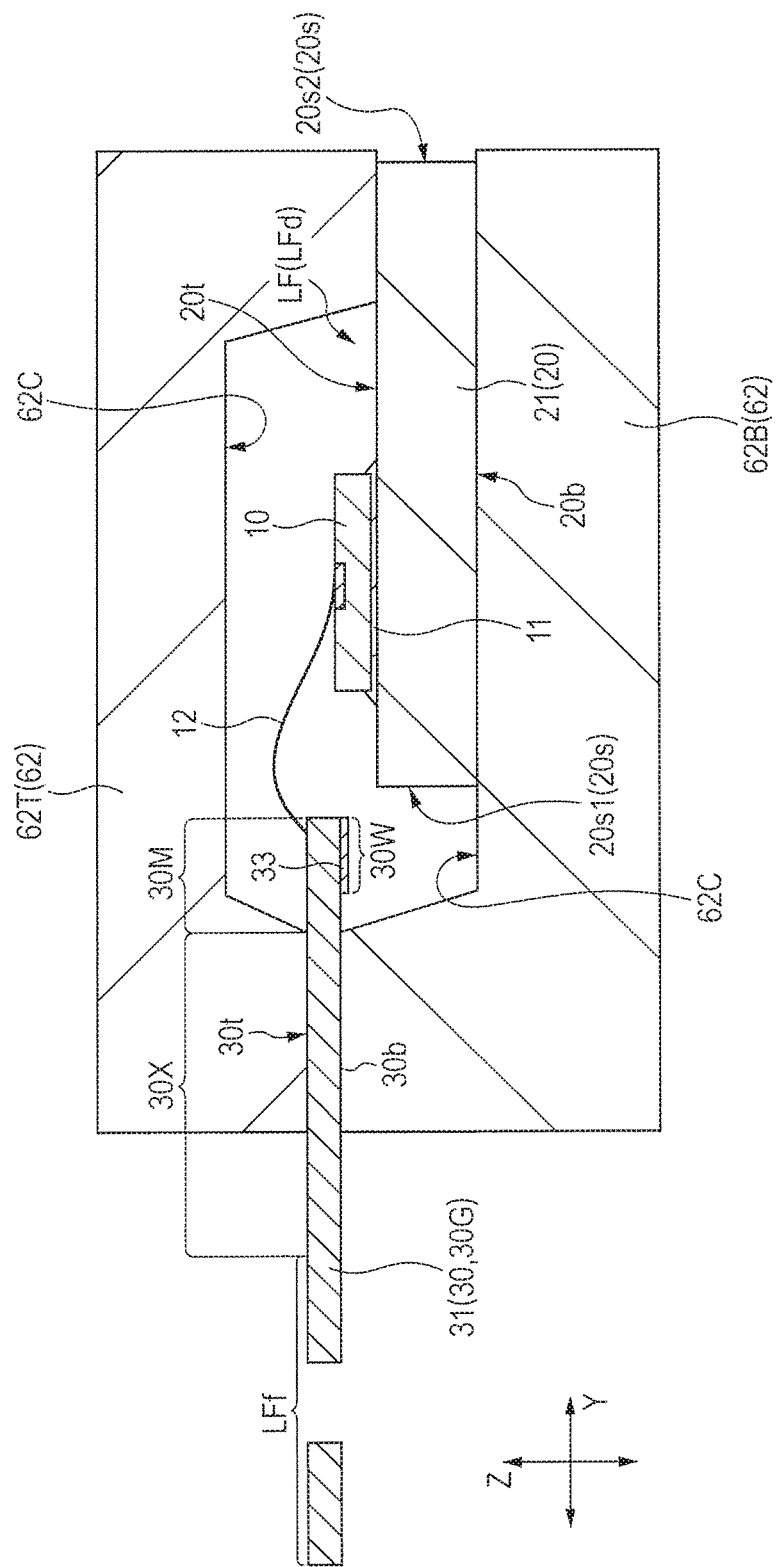
FIG. 26 is an enlarged cross-sectional view illustrating a state where a lead frame is arranged in a molding die in a cross-section taken along line A-A in FIG. 25.

Next, in a sealing step illustrated in FIG. 16, the semiconductor chip 10, a portion of the die pad 20, a portion of each of the leads 30, and the wires 12 illustrated in FIG. 24 are sealed by an insulating resin to form the sealing body 40 illustrated in FIG. 25. FIG. 25 is an enlarged plan view illustrating a state where a sealing body sealing the semiconductor chip illustrated in FIG. 24 and the wires is formed. FIG. 26 is an enlarged cross-sectional view illustrating a state where a lead frame is arranged in a molding die in a cross-section along line A-A in FIG. 25.

In this step, the sealing body 40 is formed by a so-called transfer molding method by using a molding die 62 including a top die (a first die) 62T and a bottom die (a second die) 62B, as illustrated in FIG. 26, for example.

In the example illustrated in FIG. 26, the lead frame LF is arranged such that the die pad 20 and a portion of each of the leads 30 of the device forming portion LFd are located within a cavity 62C formed by the top die 62T and the bottom die 62B. The lead frame LF is then clamped by (interposed between) the top die 62T and the bottom die 62B. When a thermosetting resin (the insulating resin) that is softened (plasticized) is injected into the cavity 62C of the molding die 62 in this state, the insulating resin is supplied to a space formed by the cavity 62C and the bottom die 62B to be molded in accordance with the shape of the cavity 62C.

In this molding, a portion of the upper surface 20t of the die pad 20, which is continuous with the side surface 20s2, is pressed by the top die 62T, as illustrated in FIG. 26. The portion of the upper surface 20t of the die pad 20, which is continuous with the side surface 20s2, is in close contact with the top die 62T. Further, the lower surface 20b of the die pad 20 is pressed by the bottom die 62B. In the example illustrated in FIG. 26, the entire lower surface 20b of the die pad 20 is in close contact with the bottom die 62B. Therefore, after this step, a portion of the die pad 20, which includes the side surface 20s2, is exposed from the sealing body 40, as illustrated in FIG. 25.

In addition, at least a portion of the metal film 33 is arranged within the cavity 62C in this step. In the example illustrated in FIG. 26, the metal film 33 is entirely arranged within the cavity 62C. By this arrangement, at least the portion of the metal film 33 (the entire metal film 33 in the example illustrated in FIG. 26) is sealed by the sealing body 40 illustrated in FIG. 25. By sealing at least the portion of the metal film 33 in this manner, peeling can be caused at the bonding interface between the metal film 33 and the sealing body 40.

After the sealing body 40 is molded, heating is performed until a portion of the thermosetting resin included in the sealing body 40 is set (this process is called temporary curing). After this temporary curing enables the lead frame LF to be brought out from the molding die 62, the lead frame LF is brought out from the molding die 62. Thereafter, the lead frame LF is transferred into a heating furnace and is further subjected to a heat treatment (cure baking). By this heat treatment, the remaining portion of the thermosetting resin is set, so that the sealing body 40 illustrated in FIG. 25 is obtained.

The sealing body 40 is formed by an insulating resin as a main component. Further, by mixing filler particles, such as particles of silica (silicon dioxide; $SiO_2$) into the thermosetting resin, a function of the sealing body 40 (e.g., resistance to warpage) can be improved.

<Plating Step>

Figure 27:
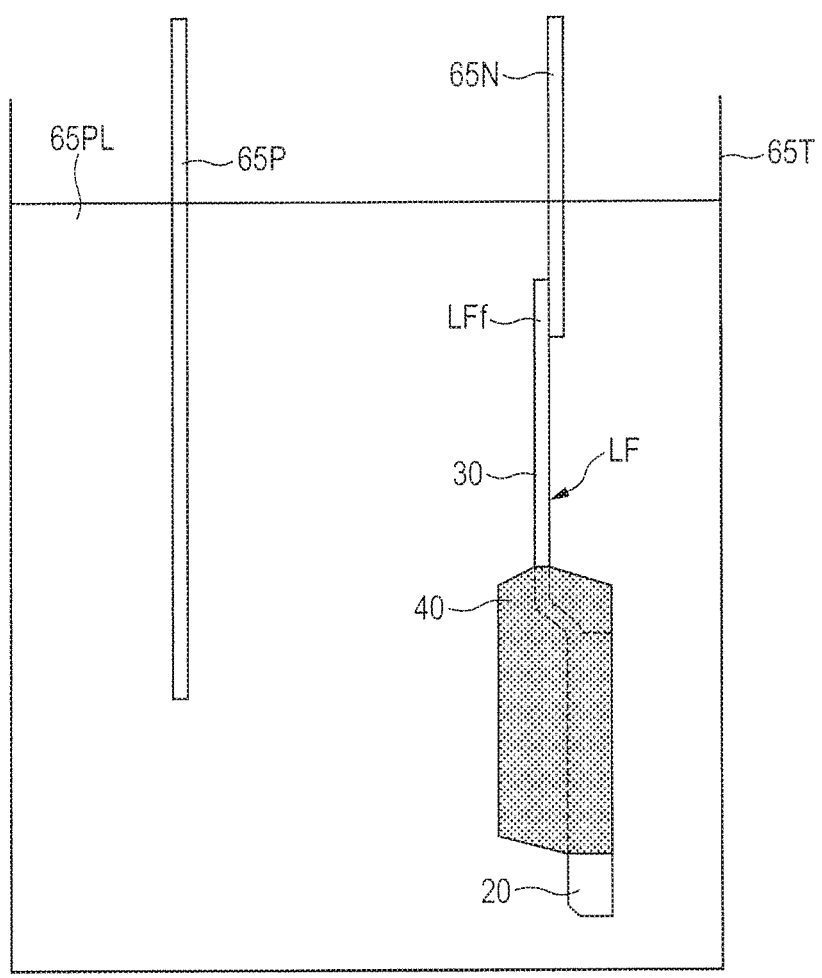
FIG. 27 is an explanatory view illustrating an outline of a plating step by electrolytic plating.

Next, in a plating step illustrated in FIG. 16, the lead frame LF is immersed in a plating solution (not illustrated), so that a metal film (the metal film 22 and the metal film 32 illustrated in FIGS. 6 to 8) is formed on a surface of a metal portion (an outer portion) that is exposed from the sealing body 40. FIG. 27 is an explanatory view illustrating an outline of a plating step by electrolytic plating.

In this step, the metal films 22 and 32 (see FIGS. 6 to 8) made of solder, for example, is formed on a surface of a metal member exposed from a resin by electrolytic plating. In electrolytic plating, the lead frame LF, which is an object to be processed, is arranged in a plating tank 65T having a plating solution 65PL therein. The object to be processed is coupled to a cathode 65N in the plating tank 65T. For example, the frame LFf of the lead frame LF is electrically coupled to the cathode 65N in the example illustrated in FIG. 27. A direct-current voltage, for example, is applied across this cathode 65N and an anode 65P arranged in the plating tank 65N in the same manner, thereby foaming the metal films 22 and 32 on the exposed surface of the metal member coupled to the frame LFf of the lead frame LF. That is, the metal films 22 and 32 are formed by so-called electrolytic plating in the present embodiment.

In the plating step, chemical polishing may be performed for a surface of the die pad 20 or the lead 30 illustrated in FIG. 25 as a pretreatment before the lead frame LF is immersed in the plating solution 65PL illustrated in FIG. 27, although illustration is omitted in FIG. 16. By performing the pretreatment before the lead frame LF is immersed in the plating solution 65PL, an oxide film on a surface of the lead frame LF, which is exposed from the sealing body 40 (see FIG. 25), or minute burrs can be removed.

The metal films 22 and 32 of tie present embodiment are formed of so-called lead-free solder that contains substantially no lead (Pb) therein as described above, and is made of tin (Sn) only, tin-bismuth (Sn—Bi), or tin-copper-silver (Sn—Cu—Ag), for example. Therefore, the plating solution 65PL used in this plating step is an electrolytic plating solution containing a metal salt, such as $Sn^{2+}$ or $Bi^{3+}$. Although alloying metal plating with Sn—Bi is described as an example of lead-free solder plating, it is possible to replace bismuth (Bi) with a metal, such as copper (Cu) or silver (Ag), or to use an electrolytic plating solution in which copper (Cu) or silver (Ag) is added in addition to bismuth (Bi).

In the present embodiment, the plating step is performed while the die pad 20 is electrically coupled to the frame LFf via the lead 30. When a voltage is applied across the anode 65P and the cathode 65N illustrated in FIG. 27 while the lead frame LF is immersed in the plating solution 65PL, a current flows between the lead 30 and the die pad 20 that are coupled to the cathode and the anode 65PL via the plating solution 65PL. During this, $Sn^{2+}$ and $Bi^{3+}$ in the plating solution 65PL are deposited at a predetermined ratio on surfaces of the lead 30 and the die pad 20, which are exposed from the sealing body 40, so that the metal films 22 and 32 illustrated in FIGS. 6 to 8 are formed. The thickness of the metal films 22 and 32 can be changed in accordance with the specification of a product. For example, a film having a thickness of about 7 µm to about 15 µm is deposited.

In a case where a portion of the bonding interface between the sealing body 40 and the lead 30 includes a gap therein in a peripheral portion of the sealing body 40 (see FIG. 25), a portion of a plated film formed by this step may be formed inside the sealing body 40. In other words, the metal film 32 may be formed in a portion of the inner portion 30M of the lead 30 illustrated in FIGS. 6 to 8, which is close to the boundary between the inner portion 30M and the outer portion 30X. However, the thus formed metal film 32 is not bonded to the sealing body 40 from the beginning. Therefore, even if the metal film 32 is formed in the inner portion 30M of the lead 30 after the sealing body 40 is hardened, that metal film does not contribute to control of an occurring position of peeling at the bonding interface between the sealing body 40 and the lead 30.

<Dicing Step>

Figure 28:
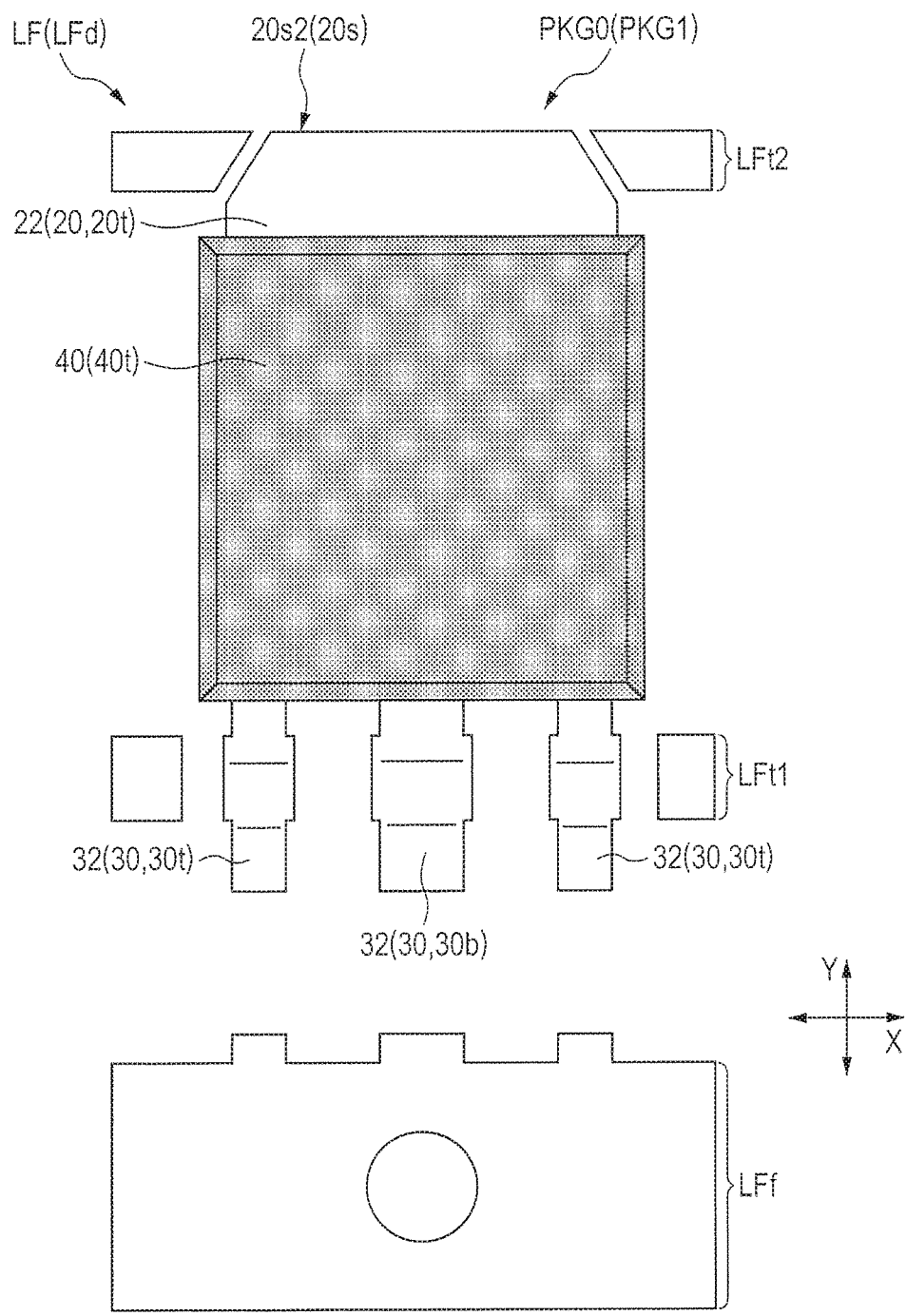
FIG. 28 is an enlarged plan view illustrating a state where each of the device forming portions is separated in a dicing step illustrated in FIG. 16.

Next, in a dicing step illustrated in FIG. 16, an assembly PKG0 corresponding to the semiconductor device PKG1 (see FIG. 3) is separated from the frame LFf and the tie bars LFt1 and LFt2 of the lead frame LF, to be diced as illustrated in FIG. 23. FIG. 28 is an enlarged plan view illustrating a state where each of the device forming portions is separated in the dicing step illustrated in FIG. 16.

In this step, the tie bar LFt2 is cut, and the die pads 20 coupled to each other via the tie bar LFt2 are separated from each other. Also, in this step, the tie bar LFt1 is cut, and the leads 30 and the frame LFf are separated from each other, so that the leads 30 are separated from each other.

A method of cutting the tie bars LFt1 and LFt2 and the leads 30, metal stamping (cutting) using a punch and a die can be used, as with the method described with reference to FIG. 22. Because this step is performed after the plating step, a side surface that is newly formed by cutting in this step is exposed from the plated film.

In addition, in this step, each of the lead 30 is subjected to bending to be shaped, so that the lead 30 having a shape illustrated in FIG. 6, for example, is obtained (this step can be considered as a lead shaping step that is different from the dicing step). Further, as method of shaping the lead 30, metal stamping (bending) by a die, described with reference to FIG. 22, can be used, for example.

Cutting of the tie bar LFt1, cutting of the leads 30, and shaping the lead 30 maybe performed independently of one another, or a portion or all of them may be performed at once.

<Annealing Step>

Next, in an annealing step illustrated in FIG. 16, a heat treatment (annealing) is performed for the metal films 22 and 32 (see FIGS. 6 to 8) formed in the above plating step, so that strain inside the metal films 22 and 32 is reduced. An example of a condition for annealing is that heating is performed at 150° C. for about 1 to 2 hours. In a modified example with respect to the present embodiment, annealing can be omitted. However, strain in the metal films 22 and 32 generated in the dicing step can be removed by performing annealing for the metal films 22 and 32.

After this step, an inspection and a test that are necessary, e.g., an appearance inspection and an electrical test, are performed, and those that have passed the inspection and the test are the semiconductor devices PKG1 illustrated in FIG. 3 that are finished products. Thereafter, the semiconductor device PKG1 is shipped or mounted on a mounting substrate (not illustrated).

<Evaluation>

Next, results of evaluation performed for the above-described semiconductor device of the present embodiment are described. Evaluation was performed with regard to the presence or absence of peeling between a lead and a sealing body on a wire bonding surface side and a state of electrical coupling between a wire and the lead. For this evaluation, a plurality of types of samples that are different in manufacturing condition for the metal film 33 illustrated in FIG. 6 were fabricated, the number of samples of each type being 20. Evaluation was performed at several timings from a timing immediately after completion of a package to a timing at which a temperature cycle test of 2000 cycles was finished. As an evaluation method, first, it was evaluated whether presence or absence of peeling between the sealing body 40 and the lead 30 from each other at a wire bonding surface (the upper surface 30t illustrated in FIG. 6) of a lead. More specifically, an ultrasonic inspection was performed for each of the samples for each manufacturing condition, and the number of samples in which peeling was confirmed was evaluated. In evaluation of the state of electrical coupling between the wire and the lead, a continuity test was performed for each of the samples for each manufacturing condition, and the number of samples in which electrical disconnection was confirmed was evaluated.

The timings of evaluation include four timings including a timing after the annealing step illustrated in FIG. 16 (hereinafter, referred to as "after assembly"), a timing after a heat treatment that is considered as reflow heating when a semiconductor device is mounted (hereinafter, referred to as "after heating"), a timing after 1000 cycles of temperature cyclic loading (hereinafter, referred to as "after 1000 cycles") and a timing after 2000 cycles of temperature cyclic loading (hereinafter, referred to as "after 2000 cycles"). In the heat treatment, each sample was left at a temperature of in an atmosphere with a relative humidity of 85% RH for 168 hours and thereafter infrared reflow heating was performed in accordance with such a temperature profile that a peak temperature reached 260° C. One cycle of temperature cyclic loading was from a temperature rise from −55° C. to 150° C. to a temperature fall to −55° C.

The manufacturing conditions of the samples were the same, except for the presence or absence and the type of the metal film formed on the upper surface 30t or the lower surface 30b of the lead 30 illustrated in FIG. 6. For example, the base member 31 of the lead 30 was made of copper (Cu), and an aluminum wire having a line diameter of 125 μm was bonded thereto by wedge bonding. Further, in a case of a sample having a metal film formed therein, the thickness of each metal film was set to 1.0 μm in principle. (However, in the third sample described later, evaluation was performed for four thicknesses.)

First, evaluation was performed for a sample without the metal film 33 illustrated in FIG. 6 (more specifically, a sample in which no metal film was formed in each of the upper surface 30t and the lower surface 30b) as the first sample. In evaluation of peeling between the sealing body and the lead, peeling was confirmed in 50% of the samples after heating, 70% of the samples after 1000 cycles, and 85% of the samples after 2000 cycles. In evaluation of the state of electrical coupling, no disconnection was confirmed until the timing after 1000 cycles, but disconnection was confirmed in a portion (35%) of the samples after 2000 cycles.

The evaluation result for the first sample showed that it was difficult to obtain durability against temperature cyclic loading exceeding 1000 cycles, by a structure in which the base member 31 was exposed on both the upper surface 30t and the lower surface 30b of the wire bonding portion 30W illustrated in FIG. 6.

Next, evaluation was performed for a sample in which a metal film (a Ni/Pd/Au lamination film) was formed to entirely cover the upper surface 30t, the lower surface 30b, and both the side surfaces 30s of the base member 31 of the lead 30 illustrated in FIG. 14, as the second sample. In evaluation of peeling between the sealing body and the lead, peeling occurred more easily than the first sample, and peeling was already confirmed in 35% of samples after assembly and in all samples after 1000 cycles. In evaluation of the state of electrical coupling, disconnection was not confirmed until the timing after 1000 cycles, but was confirmed in a portion of samples after 2000 cycles. The evaluation results for the second sample showed that it was difficult to control the occurring position of peeling even by forming metal films made of the same material on both the upper surface 30t and the lower surface 30b of the wire bonding portion 30W illustrated in FIG. 6 and therefore it was difficult to obtain durability against temperature cyclic loading exceeding 1000 cycles. In a case where metal films made of mutually different metal materials are formed on the upper surface 30t and the lower surface 30b, the occurring position of peeling may be able to controlled, although the details will be described later. That is, in a case where the bonding strength between the metal film on the lower surface 30b side and the sealing body 40 is equal to or less than a half of the bonding strength between the metal film on the upper surface 30t side and the sealing body 40, peeling can occur easily on the lower surface 30b side.

Next, evaluation was performed for a sample having the same structure as that of the semiconductor device PKG1 illustrated in FIG. 6, that is, a structure in which the metal film 33 was formed on the lower surface 30b of the wire bonding portion 33W and no metal film was formed on the upper surface 30t, as the third sample. As the metal film 33, a nickel film was formed by electrolytic plating. In evaluation of peeling between the sealing body and the lead, no peeling was confirmed on the upper surface 30t side at all the timings from the timing after assembly until the timing after 2000 cycles (while peeling was confirmed on the lower surface 30b side in all samples at the timing after heating). Also in evaluation of the state of electrical coupling, disconnection was not confirmed at all the timings, i.e., until the timing after 2000 cycles. The evaluation results for the third sample showed that reliability of electrical coupling was able to be improved by forming the metal film 33 selectively on the lower surface 30b side as in the present embodiment. Further, in order to study a relation between the thickness of the metal film 33 and occurrence of peeling, samples in which the thickness of the metal film 33 was set to 0.1 μm, 0.5 μm, 1.0 μm, and 3.0 μm were fabricated and were subjected to evaluation, the number of each sample being 20. Peeling on the upper surface 30t and electrical disconnection were not confirmed in any of the samples. From this result, it was found that it was possible to control the occurring position of peeling regardless of the thickness of the metal film 33, as long as the metal film 33 was formed selectively on the lower surface 30b side.

Furthermore, in order to study a relation between the type of a metal material forming the metal film 33 and occurrence of peeling, three types of samples in a case where the metal material forming the metal film 33 was a nickel (Ni—P) film obtained by electroless plating, in a case where the metal material was a Ni/Pd/Au lamination film, and in a case where the metal material was a silver (Ag) film were fabricated and were subjected to evaluation, the number of samples of each type being 20. As a result of the evaluation, electrical disconnection in the upper surface 30*t* was not confirmed in any of the samples. From this result, it was found that when the metal film 33 was formed selectively on the lower surface 30*b* side, it was possible to cause peeling on the lower surface 30*b* side, thus improving reliability of electrical coupling between the lead and the wire.

In the above, the invention made by the inventors of the present application has been specifically described by way of the embodiment. However, it is naturally understood that the present invention is not limited to only the aforementioned embodiments and the modified examples described in the aforementioned embodiment, and can be changed in various ways within the scope not departing from the gist thereof. Typical modified examples are described below.

MODIFIED EXAMPLE 1

Figure 29:
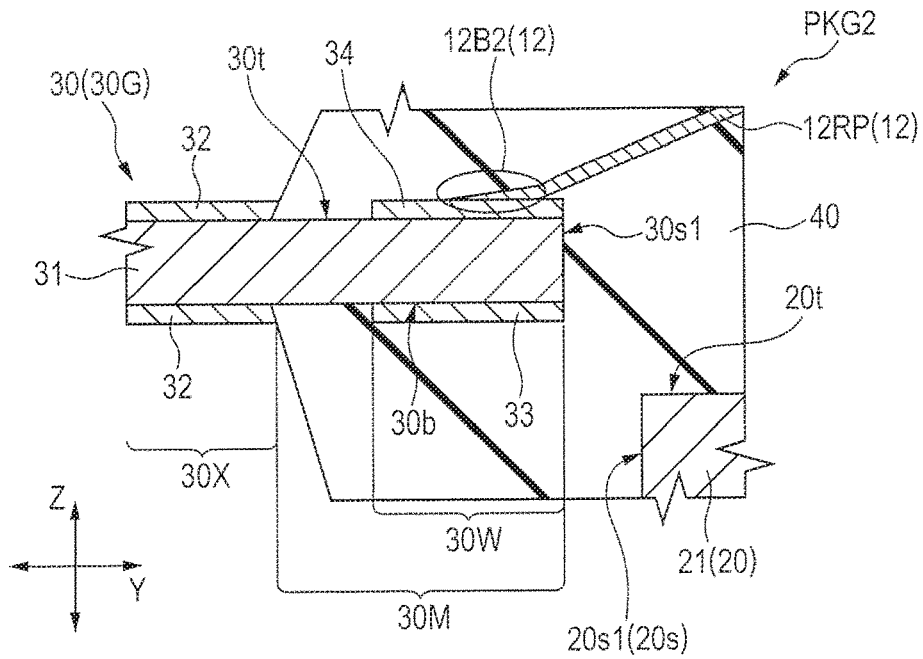
FIG. 29 is an enlarged cross-sectional view of a semiconductor device that is a modified example with respect to FIG. 13.

The embodiment in which no metal film is formed on the upper surface 30*t* of the lead 30 as illustrated in FIGS. 13 and 14, is described above. However, from a viewpoint that peeling is caused to occur on the lower surface 30*b* side with priority, a method can be considered in which metal films made of mutually different metal materials are formed on the upper surface 30*t* and the lower surface 30*b*, respectively, as illustrated in FIG. 29. FIG. 29 is an enlarged cross-sectional view of a semiconductor device that is a modified example with respect to FIG. 13.

A semiconductor device PKG2 illustrated in FIG. 29 is different from the semiconductor device PKG1 illustrated in FIG. 13 in that a metal film 34 is formed on the upper surface 30*t* of the wire bonding portion 30W. More specifically, the metal film 33 made of a first metal material (e.g., a nickel film formed by electrolytic plating) is formed on the lower surface 30*b* in the inner portion 30M of the lead 30 of the semiconductor device PKG2. Further, the metal film 34 made of a second metal material different from the first metal material (e.g., a silver film) is formed on the upper surface 30*t* in the wire bonding portion 30W of the inner portion 30M of the lead 30, to which the wire 12 is coupled.

In the semiconductor device PKG2, when only the upper surface 30*t* side is considered, peeling can more easily occur at a bonding interface between the metal film 34 and the sealing body 40 because the metal film 34 is formed, as compared with a case where but not formed. However, as illustrated in FIG. 29, the metal film 33 that is weaker in strength of bonding to the sealing body 40 than the metal film 34 is formed on the lower surface 30*b* of the wire bonding portion 30W. In this case, the metal film 33 peels from the sealing body 40 more early, so that stress applied to the bonding interface between the metal film 34 and the sealing body 40 can be reduced. Consequently, it is possible to suppress peeling between the metal film 34 and the sealing body 40, as compared with a case where no metal film is formed on the lower surface 30*b* and the metal film 34*h* is formed on the upper surface 30*t* only as in the semiconductor device PKGh1 illustrated in FIG. 10.

Ideally, the metal film 33 can peel more early, if the strength of bonding between the metal film 33 and the sealing body 40 is even a little weaker than that between the metal film 34 and the sealing body 40. However, from a viewpoint of reliably causing peeling at the bonding interface between the metal film 33 and the sealing body 40, it is preferable that a ratio of the strength of bonding is twice or more. In other words, the strength of bonding between the metal film 33 and the sealing body 40 is equal to or less than a half of the strength of bonding between the metal film 34 and the sealing body 40. The ratio of the strength of bonding can be measured as a result of a shear test performed after a sample is fabricated, as in the method described with reference to Table 1.

By formation of the metal film 34 in a portion to which the wire 12 is bonded, as in the semiconductor device PKG2, the wire 12 is bonded to the wire bonding portion 30W of the lead 30 via the metal film 34. In this case, a combination of the wire 12 and the metal film 34 can improve the strength of bonding of the wire 12 to the lead 30. In this case, lowering of electric characteristics can be suppressed, even when peeling between the sealing body 40 and the metal film 34 occurs.

Meanwhile, in a case where no metal film is formed on the upper surface 30*t* of the wire bonding portion 30W as illustrated in FIG. 13, the sealing body 40 and the base member 31 are bonded directly to each other. Therefore, the strength of bonding that is higher than that in the semiconductor device PKG2 is obtained, and this configuration is preferable from a viewpoint of suppressing peeling between the sealing body 40 and the lead 30.

The semiconductor device PKG2 illustrated in FIG. 29 is has the same structure as the semiconductor device PKG1 illustrated in FIG. 13 except for the above-described differences. Therefore redundant description is omitted.

MODIFIED EXAMPLE 2

Figure 30:
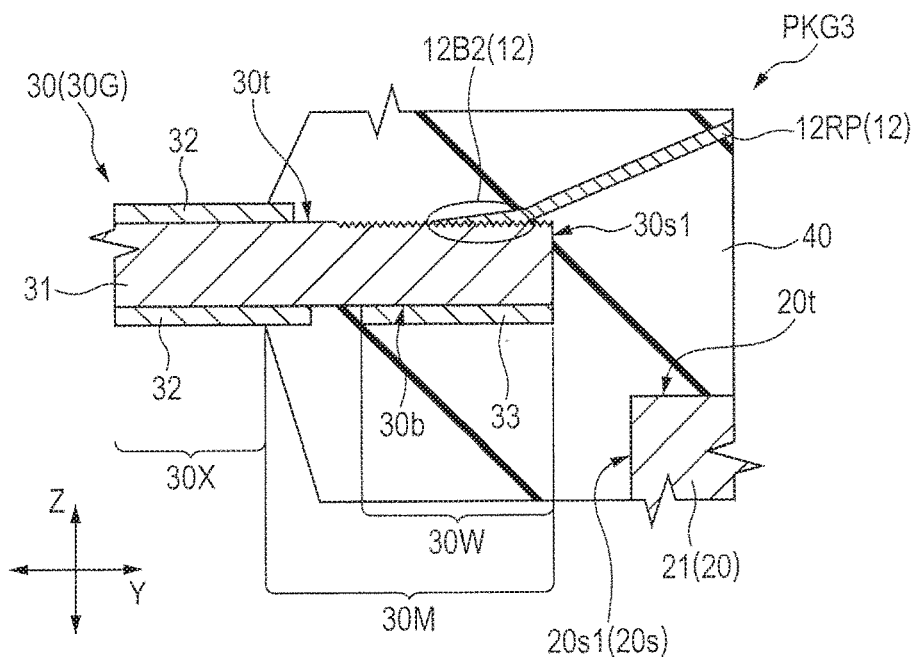
FIG. 30 is an enlarged cross-sectional view of a semiconductor device that is another modified example with respect to FIG. 13.

As another embodiment for improving the strength of bonding between the wire 12 and the lead 30, a roughening treatment may be performed for the upper surface 30*t* of the lead 30, as in a semiconductor device PKG3 illustrated, in FIG. 30. FIG. 30 is an enlarged cross-sectional view of a semiconductor device that is another modified example with respect to FIG. 13.

The semiconductor device PKG3 illustrated in FIG. 30 is different from the semiconductor device PKG1 illustrated in FIG. 13 in that surface roughness (arithmetic average roughness Ra, the same shall apply hereinafter) of the base member 31 on the upper surface 30*t* is different from that on the lower surface 30*b*. More specifically, in the base member 31 of the lead 30 included in the semiconductor device PKG3, the surface roughness of the upper surface 30*t* in the wire bonding portion 30W is rougher than that of the lower surface 30*b* in the inner portion 30M. In other words, in the base member 31 of the lead 30 included in the semiconductor device PKG3, the upper surface 30*t* in the wire bonding portion 30W is roughened. For example, in the example illustrated in FIG. 30, a value of the surface roughness of the lower surface 30*b* is about 0.1 μm. On the other hand, a value of the surface roughness of the upper surface 30*t* of the wire bonding portion 30W is about 0.2 μm or more and about 1.0 μm or less.

In a case where a surface to which the wire 12 is bonded is roughened as in the semiconductor device PKG3, the strength of bonding between the wire 12 and the lead 30 can be improved. Further, even if the upper surface 30*t* of the lead 30 is roughened, it is possible to control an occurring position of peeling at the bonding interface between the sealing body 40 and the lead 30 as long as the metal film 33 is formed. Therefore, in the semiconductor device PKG3, peeling between the upper surface 30*t* of the lead 30 and the sealing body 40 can be suppressed, and the strength of bonding to the wire 12 can be improved.

In the example illustrated in FIG. 30, the upper surface 30t in the wire bonding portion 30W and its surrounding portion are roughened, whereas the other portion of the upper surface 30t is not roughened. However, in a further modified example with respect to FIG. 30, the upper surface 30t of the lead 30 may be roughened entirely. In this case, when the surface roughness is too rough, it is likely that a resin leaks to the upper surface 30t of the outer portion 30X in the sealing step. In this case, the metal film 32 (see FIG. 6) is not formed partly in the plating step, and therefore it is preferable that a value of the surface roughness is 1.0 µm or less particularly.

In a still further modified example with respect to FIG. 30, a coupling agent for improving the strength of bonding between the wire 12 and the lead 30 may be applied onto the upper surface 30t of the wire bonding portion 30W. However, in a case where application of the coupling agent causes the strength of bonding between the upper surface 30t of the lead 30 and the sealing body 40 to be lowered, a material providing the strength of bonding that is twice or more the strength of bonding between the metal film 33 and the sealing body 40 is preferable.

The semiconductor device PKG3 illustrated in FIG. 30 has the same structure as the semiconductor device PKG1 illustrated in FIG. 13 except for the above-described differences. Therefore, redundant description is omitted.

MODIFIED EXAMPLE 3

Although a MOSFET is described as an example of a power transistor included in a power semiconductor device in the above embodiment, various modified examples can be applied. For example, an IGBT may be included in place of the MOSFET. In this case, the drain of the MOSFET described in the above embodiment is read as a collector of the IGBT, and the source of the MOSFET is read as an emitter of the IGBT. In a case of using the IGBT, a diode (FWD, Free Wheeling Diode) chip that controls a flowing direction of a load current is often mounted separately from an IGBT chip. Therefore, the IGBT chip and an FWD chip are mounted on the die pad 20 illustrated in FIG. 5.

Further, a power semiconductor device is described as an example of a semiconductor device that tends to be demanded to be operable under a harsh condition regarding an environment temperature and resistance against temperature cyclic loading in the above embodiment. However, also in a case of a semiconductor device other than the power semiconductor device (e.g., a semiconductor system for a control system or a semiconductor device in a communication system), it is possible to improve a performance related to the environment temperature or the resistance against the temperature cyclic loading by applying the technique described in the above embodiment or each modified example, when demanded specifications related to the environment temperature and the resistance against the temperature cyclic loading are high. In addition, the semiconductor device other than the power semiconductor device uses a gold (Au) wire as a wire, and ball bonding is often used as the wire bonding method.

MODIFIED EXAMPLE 4

Although various modified examples are described above, the above-described modified examples can be applied in a combination. Further, a portion of each of the modified examples may be extracted and combined with a portion or an entire portion of the other modified example.

In addition, a technical idea regarding the manufacturing method of the semiconductor device described in the above embodiment can be represented as follows, when being extracted.

[Appendix 1]

A manufacturing method of a semiconductor device comprising the steps of:

(a) preparing a lead frame including a die pad having a first surface and a second surface opposite to the first surface, a first lead spaced apart from the die pad and having a third surface on the same side as the first surface of the die pad and a fourth surface opposite to the third surface, and a frame to support the die pad and the first lead;

(b) mounting a semiconductor chip on the first surface of the die pad;

(c) bonding the first wire to the third surface of a wire bonding portion of the first lead to electrically couple a first electrode of the semiconductor chip with the first lead; and (d) sealing the semiconductor chip, an inner portion of the first lead, and the first wire by a resin such that an outer portion of the first lead is exposed, to form a sealing body, wherein a first metal film is formed on the fourth surface in the inner portion of the first lead, and no metal film is formed on the third surface in the wire bonding portion of the inner portion of the first lead.

What is claimed is:

1. A semiconductor device comprising:

a die pad having a first surface and a second surface opposite to the first surface;

a first lead spaced apart from the die pad;

a semiconductor chip having a power transistor, and mounted over the first surface of the die pad via a die bonding material;

a first wire electrically connecting a first electrode of the semiconductor chip with the first lead; and a resin sealing body sealing the semiconductor chip, an inner portion of the first lead and the first wire such that an outer portion of the first lead is exposed, wherein the first lead has a third surface that is on the same side as the first surface of the die pad, and a fourth surface opposite to the third surface, wherein the third surface in the inner portion of the first lead and the fourth surface in the inner portion of the first lead are covered with the resin sealing body, wherein the first wire is bonded to the third surface of a wire bonding portion of the inner portion of the first lead, and wherein a metal film is formed on each of the fourth surface in the inner portion of the first lead, the third surface in the outer portion of the first lead, and the fourth surface in the outer portion of the first lead, without forming the metal film on an entirety of the third surface in the inner portion of the first lead.

2. The semiconductor device according to claim 1, wherein the metal film is formed on the fourth surface of the wire bonding portion of the inner portion of the first lead.

3. The semiconductor device according to claim 2, wherein the wire bonding portion of the first lead has a first apical surface located on an opposite side to a boundary between the inner portion and the outer portion in the inner portion, wherein the fourth surface of the wire bonding portion of the first lead has a first corner crossing the first apical surface, and wherein the metal film is formed in a region including the first corner.

4. The semiconductor device according to claim 3, wherein the metal film is formed on the entire fourth surface of the wire bonding portion.

5. The semiconductor device according to claim 3, wherein no metal film is formed on a portion of the fourth surface of the first lead in the inner portion, and a base member of the first lead is in contact with the resin sealing body over the portion of the fourth surface.

6. The semiconductor device according to claim 2, wherein the metal film is made of a metal material different from a metal material forming a base member of the first lead.

7. The semiconductor device according to claim 2, wherein the die pad and the first lead are arranged to be lined up in a first direction,
wherein the semiconductor device includes:
  a second lead that is arranged alongside the first lead in a second direction crossing the first direction and is spaced apart from the die pad;
  a second wire electrically connecting a second electrode of the semiconductor chip and the second lead; and
  the resin sealing body sealing the semiconductor chip, the inner portion of the first lead, the first wire, an inner portion of the second lead, and the second wire such that an outer portion of the second lead is exposed,
wherein the second lead has a fifth surface on the same side as the third surface of the first lead and a sixth surface opposite to the fifth surface,
wherein the fifth surface in the inner portion of the second lead and the sixth surface in the inner portion of the second lead are covered with the resin sealing body,
wherein the second wire is bonded to the fifth surface of a wire bonding portion of the inner portion of the second lead,
wherein the metal film is formed on the sixth surface in the wire bonding portion of the inner portion of the second lead, and
wherein no metal film is formed on the fifth surface in the wire bonding portion of the inner portion of the second lead.

8. The semiconductor device according to claim 7, further comprising a third lead that is arranged between the first lead and the second lead along the second direction and has one end coupled to the die pad,
wherein the resin sealing body sealing the semiconductor chip, the inner portion of the first lead, the first wire, the inner portion of the second lead, the second wire, and an inner portion of the third lead such that an outer portion of the third lead is exposed,
wherein the third lead has a seventh surface that is on the same side as the first surface of the die pad, an eighth surface opposite to the seventh surface, and a first portion located between the wire bonding portion of the first lead and the wire bonding portion of the second lead in plan view,
wherein the seventh surface in the inner portion of the third lead and the eighth surface in the inner portion of the third lead are covered with the resin sealing body,
wherein the metal film is formed on the eighth surface in the first portion of the third lead, and
wherein no metal film is formed on the seventh surface in the first portion of the third lead.

9. The semiconductor device according to claim 1, wherein the first wire includes an electrode bonding portion to be bonded to the first electrode, a lead bonding portion to be bonded to the wire bonding portion of the first lead, and an extending portion extending from one of the electrode bonding portion and the lead bonding portion to the other, and
wherein a thickness of the lead bonding portion of the first wire is smaller than a line diameter of the extending portion in a thickness direction of the first lead.

10. The semiconductor device according to claim 1, wherein in a base member of the first lead, a surface roughness of the third surface in the wire bonding portion is rougher than a surface roughness of the fourth surface in the inner portion.

11. The semiconductor device according to claim 1,
wherein the inner portion has the wire bonding portion and another portion,
wherein, in plan view, a width of the wire bonding portion is greater than a width of the another portion, and
wherein the metal film is formed on the fourth surface in the inner portion of the first lead, without forming the metal film on the fourth surface in the another portion of the inner portion.

\* \* \* \* \*